(12) United States Patent
Azam et al.

(10) Patent No.: US 12,413,189 B2
(45) Date of Patent: Sep. 9, 2025

(54) METHODS AND DEVICES FOR INCREASED EFFICIENCY IN LINEAR POWER AMPLIFIER

(71) Applicant: Intel Corporation, Santa Clara, CA (US)

(72) Inventors: Ali Azam, Hillsboro, OR (US); Wayne Ballantyne, Chandler, AZ (US); LiChung Chang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 929 days.

(21) Appl. No.: 17/358,019

(22) Filed: Jun. 25, 2021

(65) Prior Publication Data

US 2022/0416735 A1    Dec. 29, 2022

(51) Int. Cl.
| | | |
|---|---|---|
| H03F 3/24 | (2006.01) | |
| H03F 1/02 | (2006.01) | |
| H03F 1/32 | (2006.01) | |
| H03F 3/72 | (2006.01) | |

(52) U.S. Cl.
CPC ............ *H03F 3/24* (2013.01); *H03F 1/0277* (2013.01); *H03F 1/32* (2013.01); *H03F 1/3211* (2013.01); *H03F 3/72* (2013.01); *H03F 2200/102* (2013.01); *H03F 2200/321* (2013.01); *H03F 2200/451* (2013.01); *H03F 2200/465* (2013.01); *H03F 2201/3215* (2013.01)

(58) Field of Classification Search
CPC . H03F 1/0277; H03F 1/32; H03F 3/24; H03F 2200/102; H03F 2200/451
See application file for complete search history.

(56) References Cited

U.S. PATENT DOCUMENTS

| | | | | |
|---|---|---|---|---|
| 5,872,481 | A | * | 2/1999 | Sevic ................ H04B 1/0483 330/51 |
| 10,276,521 | B2 | * | 4/2019 | Babcock ................ H03F 1/32 |
| 10,749,477 | B2 | * | 8/2020 | Duncan ................ H03F 3/68 |
| 11,031,912 | B2 | * | 6/2021 | Bayar ................ H03F 1/26 |
| 2016/0261293 | A1 | * | 9/2016 | Adabi ............ H04B 1/0458 |
| 2021/0022672 | A1 | * | 1/2021 | Cho | |
| 2022/0407474 | A1 | | 12/2022 | Choi et al. | |

FOREIGN PATENT DOCUMENTS

| | | | | |
|---|---|---|---|---|
| CN | 102308474 B | * | 8/2015 | ........ H03F 1/0227 |
| DE | 102015218313 A1 | * | 3/2016 | ........ H04B 1/0028 |
| EP | 3226500 A1 | * | 10/2017 | |

OTHER PUBLICATIONS

Gandotra et al., Energy-efficient device-to-device communication using adaptive resource-block allocation, 2019, Chichester: Wiley Subscription Services Inc, p. 3 (Year: 2019).*

* cited by examiner

*Primary Examiner* — Andrea Lindgren Baltzell
*Assistant Examiner* — Lance Torbjorn Bartol
(74) *Attorney, Agent, or Firm* — Viering, Jentschura & Partner mbB

(57) ABSTRACT

A power amplifier circuit including a plurality of analog power amplifiers configured to generate a output power for an output signal; at least one processor configured to: select a highest output power signal; determine an input signal power of a modulated signal; determine an output signal power based on the input signal power; compare the output signal power and the highest output power; and disable a subset of the plurality of analog power amplifiers based on the comparison, wherein a remainder of the plurality of analog power amplifiers are configured to generate the output signal power.

17 Claims, 22 Drawing Sheets

FIG 12
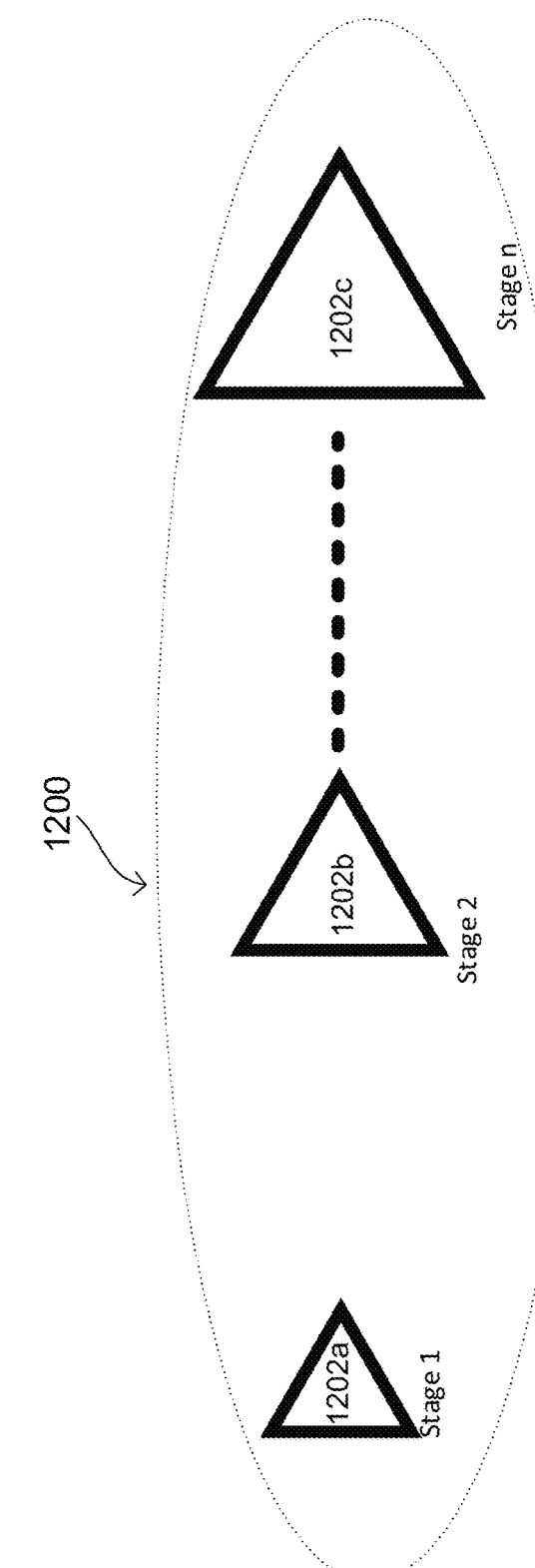
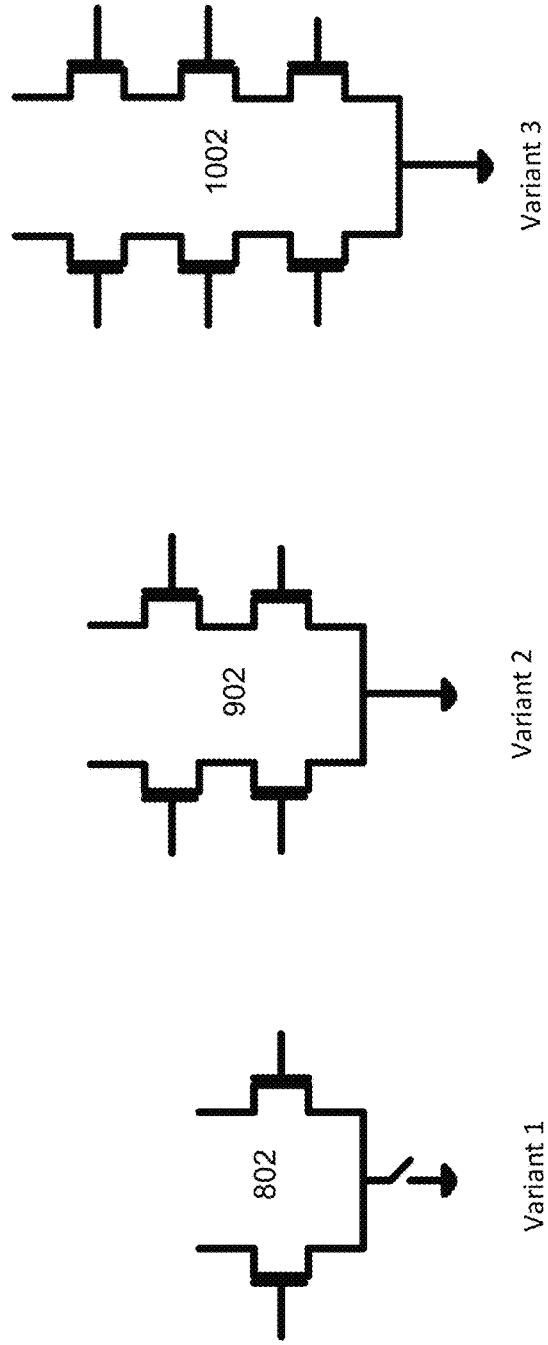
Fig: Multiple stages of PA where each stage may have any of the following variants

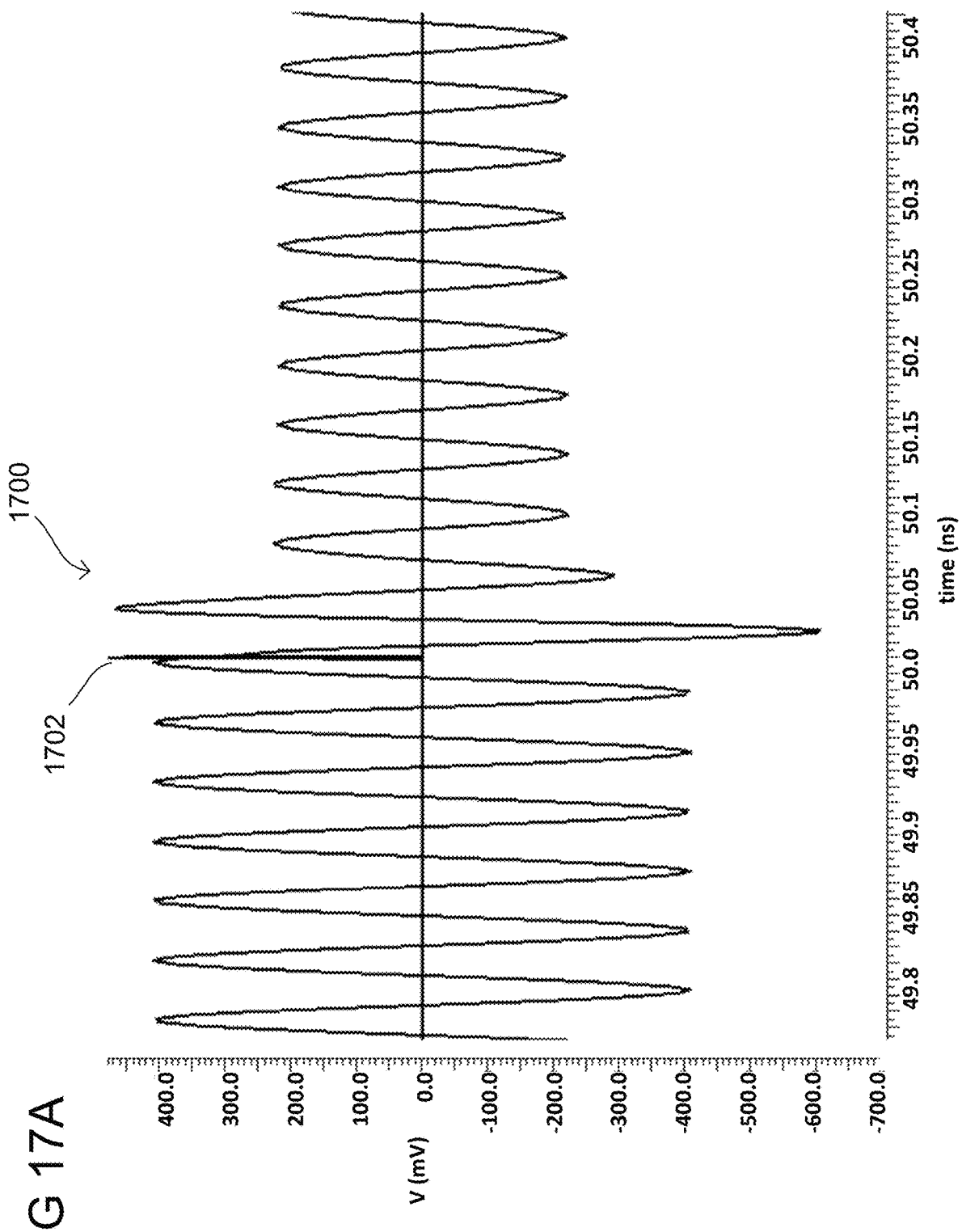

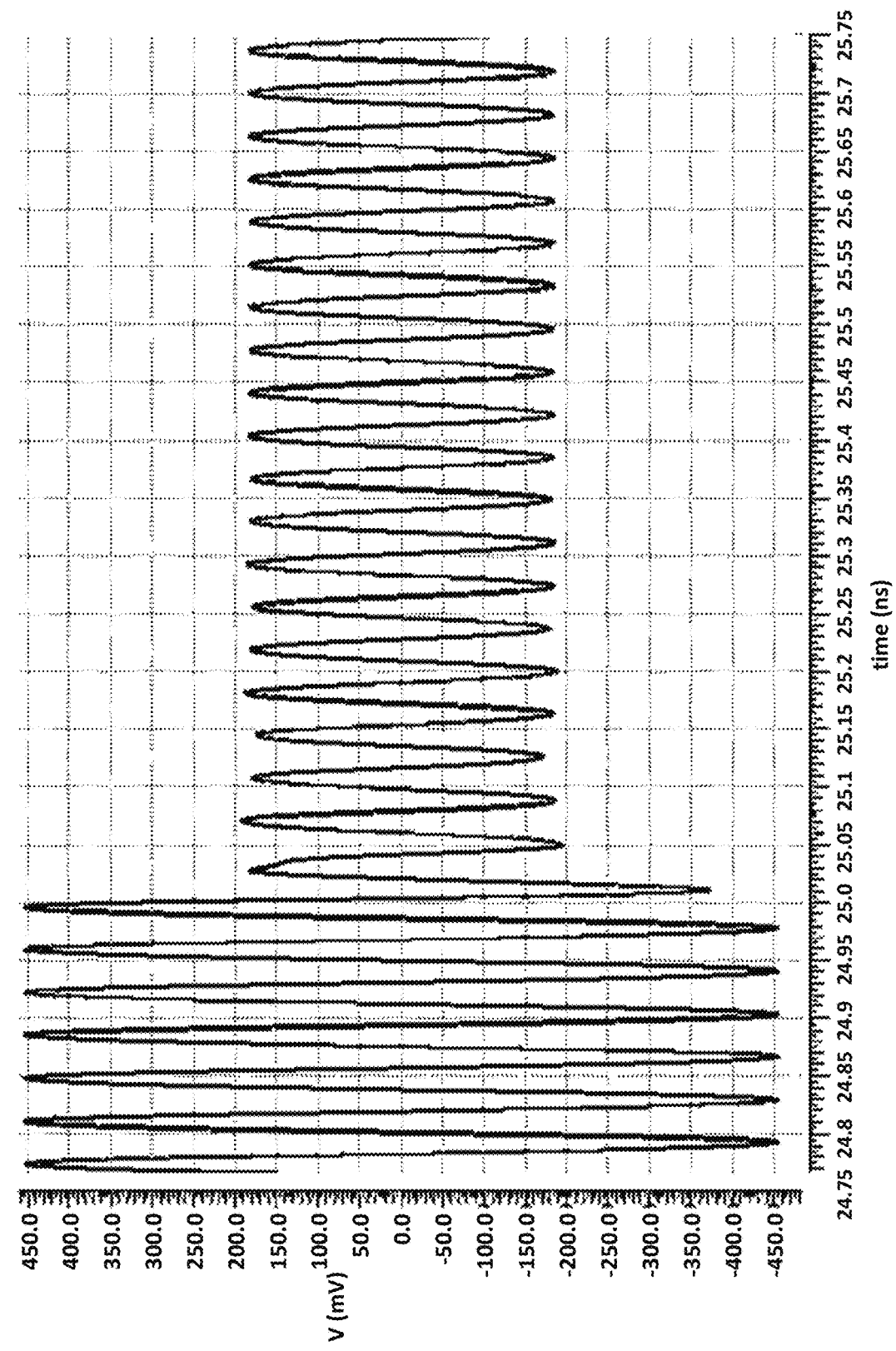

METHODS AND DEVICES FOR INCREASED EFFICIENCY IN LINEAR POWER AMPLIFIER

TECHNICAL FIELD

This disclosure generally relates to methods and devices for increasing the average efficiency of linear power amplifiers. Devices within a linear power amplifier constantly draw current irrespective of input signal level.

BACKGROUND

A digital power amplifier (PA) does not draw quiescent current, but does incur switching loss. Therefore, digital PAs are rarely used in high frequency applications. On the contrary, analog or linear PAs continuously draw static power, but do not incur switching loss. Spectral efficient modulation schemes, such as Orthogonal Frequency-Division Multiplexing (OFDM), have large peak-to-average-power-ratio (PAPR) and are often used in high frequency applications and wireless standards 3GPP and Wi-Fi. Linear PAs used in such high frequency applications are required to support peak power even though it is expected to operate at a quarter of the peak power most of the time. Since analog PAs draw an almost equal amount of DC power regardless of the signal power level, the efficiency is very low at the most probable signal level. For example, linear PAs draw a consistent static current even when they are generating an output power that is less than peak output power. Additionally, a linear PA must be configured to operate at peak power regardless of signal power in order to meet spectral mask regulations. It is desired to improve average efficiency in linear PAs by reducing DC power consumption.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 12 shows exemplary phases within a power amplifier.

FIG. 17A shows an exemplary transient behavior without a harmonic trap.

FIG. 18A shows an exemplary transient behavior with a harmonic trap.

DESCRIPTION

Figure 1:
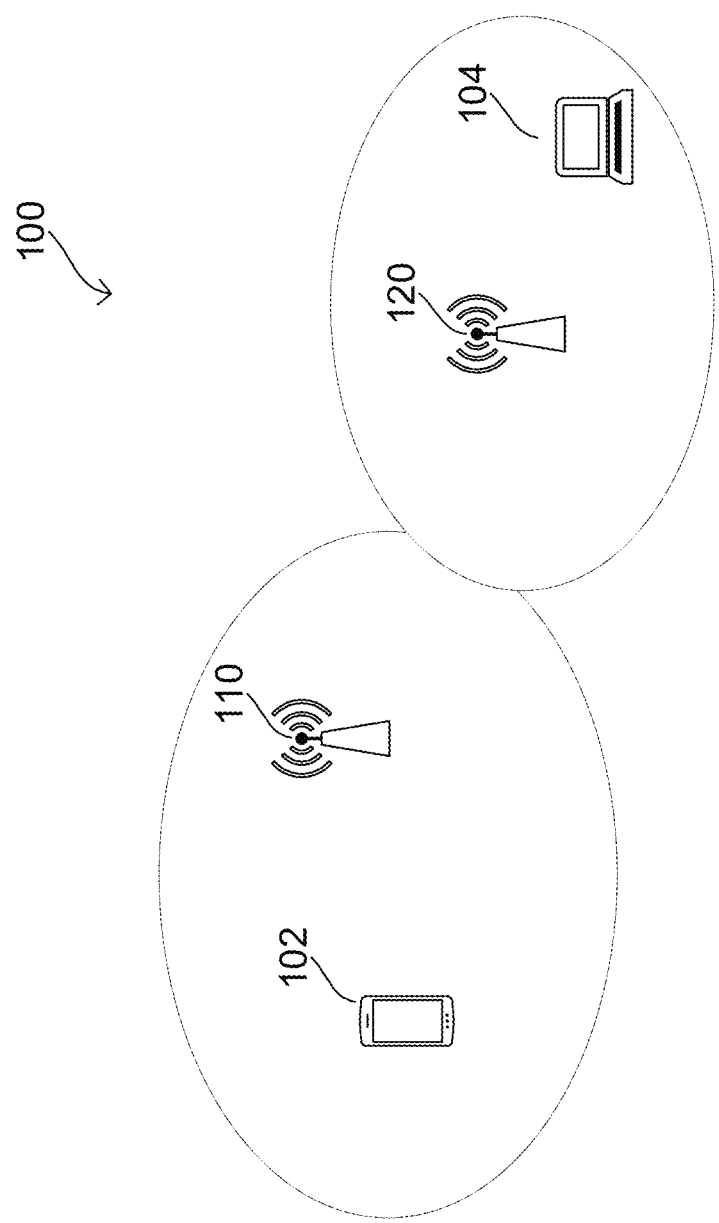
FIG. 1 shows an exemplary radio communication network.

The following detailed description refers to the accompanying drawings that show, by way of illustration, specific details in which the disclosure may be practiced.

The word "exemplary" is used herein to mean "serving as an example, instance, or illustration." The words "plurality" and "multiple" in the description and claims refer to a quantity greater than one. The terms "group," "set", "sequence," and the like refer to a quantity equal to or greater than one. Any term expressed in plural form that does not expressly state "plurality" or "multiple" similarly refers to a quantity equal to or greater than one. The term "reduced subset" refers to a subset of a set that contains less than all elements of the set. Any vector and/or matrix notation utilized herein is exemplary in nature and is employed for purposes of explanation. Examples of this disclosure described with vector and/or matrix notation are not limited to being implemented with vectors and/or matrices and the associated processes and computations may be performed in an equivalent manner with sets or sequences of data or other information.

As used herein, "memory" is understood as a non-transitory computer-readable medium in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, among others, or any combination thereof. Registers, shift registers, processor registers, data buffers, among others, are also embraced herein by the term memory. The term "software" refers to any type of executable instruction, including firmware.

The term "terminal device" utilized herein refers to user-side devices (both portable and fixed) that can connect to a core network and/or external data networks via a radio access network. "Terminal device" can include any mobile or immobile wireless communication device, including User Equipments (UEs), Mobile Stations (MSs), Stations (STAs), cellular phones, tablets, laptops, personal computers, wearables, multimedia playback and other handheld or body-mounted electronic devices, consumer/home/office/commercial appliances, vehicles, and any other electronic device capable of user-side wireless communications.

The term "network access node" as utilized herein refers to a network-side device that provides a radio access network with which terminal devices can connect and exchange information with a core network and/or external data networks through the network access node. "Network access nodes" can include any type of base station or access point, including macro base stations, micro base stations, NodeBs, evolved NodeBs (eNBs), gNodeBs (gNBs), Home base stations, Remote Radio Heads (RRHs), relay points, Wi-Fi/WLAN Access Points (APs), short-range wireless controllers (e.g., Bluetooth® master devices), DSRC RSUs, terminal devices acting as network access nodes, and any other electronic device capable of network-side wireless communications, including both immobile and mobile devices (e.g., vehicular network access nodes, moving cells, and other movable network access nodes). As used herein, a "cell" in the context of telecommunications may be understood as a sector served by a network access node. Accordingly, a cell may be a set of geographically co-located antennas that correspond to a particular sectorization of a network access node. A network access node can thus serve one or more cells (or sectors), where the cells are characterized by distinct communication channels.

The term "power amplifier (PA) device" may be used to describe a unit cell power amplifier or a slice of unit cell power amplifier.

This disclosure may utilize or be related to radio communication technologies. While some examples may refer to specific radio communication technologies, the examples provided herein may be similarly applied to various other radio communication technologies, both existing and not yet formulated, particularly in cases where such radio communication technologies share similar features as disclosed regarding the following examples. For purposes of this disclosure, radio communication technologies may be classified as one of a Short Range radio communication technology or Cellular Wide Area radio communication technology. Short Range radio communication technologies may include Bluetooth®, WLAN (e.g., according to any IEEE 802.11 standard), and other similar radio communication technologies. Cellular Wide Area radio communication technologies may include Global System for Mobile Communications (GSM), Code Division Multiple Access 2000 (CDMA2000), Universal Mobile Telecommunications System (UMTS), Long Term Evolution (LTE), General Packet Radio Service (GPRS), Evolution-Data Optimized (EV-DO), Enhanced Data Rates for GSM Evolution (EDGE), High Speed Packet Access (HSPA; including High Speed Downlink Packet Access (HSDPA), High Speed Uplink Packet Access (HSUPA), HSDPA Plus (HSDPA+), and HSUPA Plus (HSUPA+)), Worldwide Interoperability for Microwave Access (WiMax), 5G New Radio (NR), for example, and other similar radio communication technologies. Cellular Wide Area radio communication technologies also include "small cells" of such technologies, such as microcells, femtocells, and picocells. Cellular Wide Area radio communication technologies may be generally referred to herein as "cellular" communication technologies.

Unless explicitly specified, the term "transmit" encompasses both direct (point-to-point) and indirect transmission (via one or more intermediary points). Similarly, the term "receive" encompasses both direct and indirect reception. Furthermore, the terms "transmit", "receive", "communicate", and other similar terms encompass both physical transmission (e.g., the wireless transmission of radio signals) and logical transmission (e.g., the transmission of digital data over a logical software-level connection). For example, a processor (or controller or physical layer) may transmit or receive data over a software-level connection with another processor (or controller or physical layer) in the form of radio signals, where the physical transmission and reception is handled by radio-layer components such as RF transceivers and antennas, and the logical transmission and reception over the software-level connection is performed by the processors.

Many wireless communication technologies use beamforming to increase link strength between transmitter and receiver. The Third Generation Partnership Project's (3GPP) Fifth Generation (5G) New Radio (NR) standard, for example, includes mechanisms for beamforming in both the transmit and receive directions. Focusing on the terminal side, a terminal device (e.g., a UE) may identify a receive antenna beam and a transmit antenna beam for a given network access node (e.g., gNodeB). In the receive direction, the terminal device can then increase link strength by receiving signals from the network access node with the receive antenna beam. Similarly, in the transmit direction the terminal device can boost link strength by transmitting signals to the network access node with the transmit antenna beam.

Figure 2:
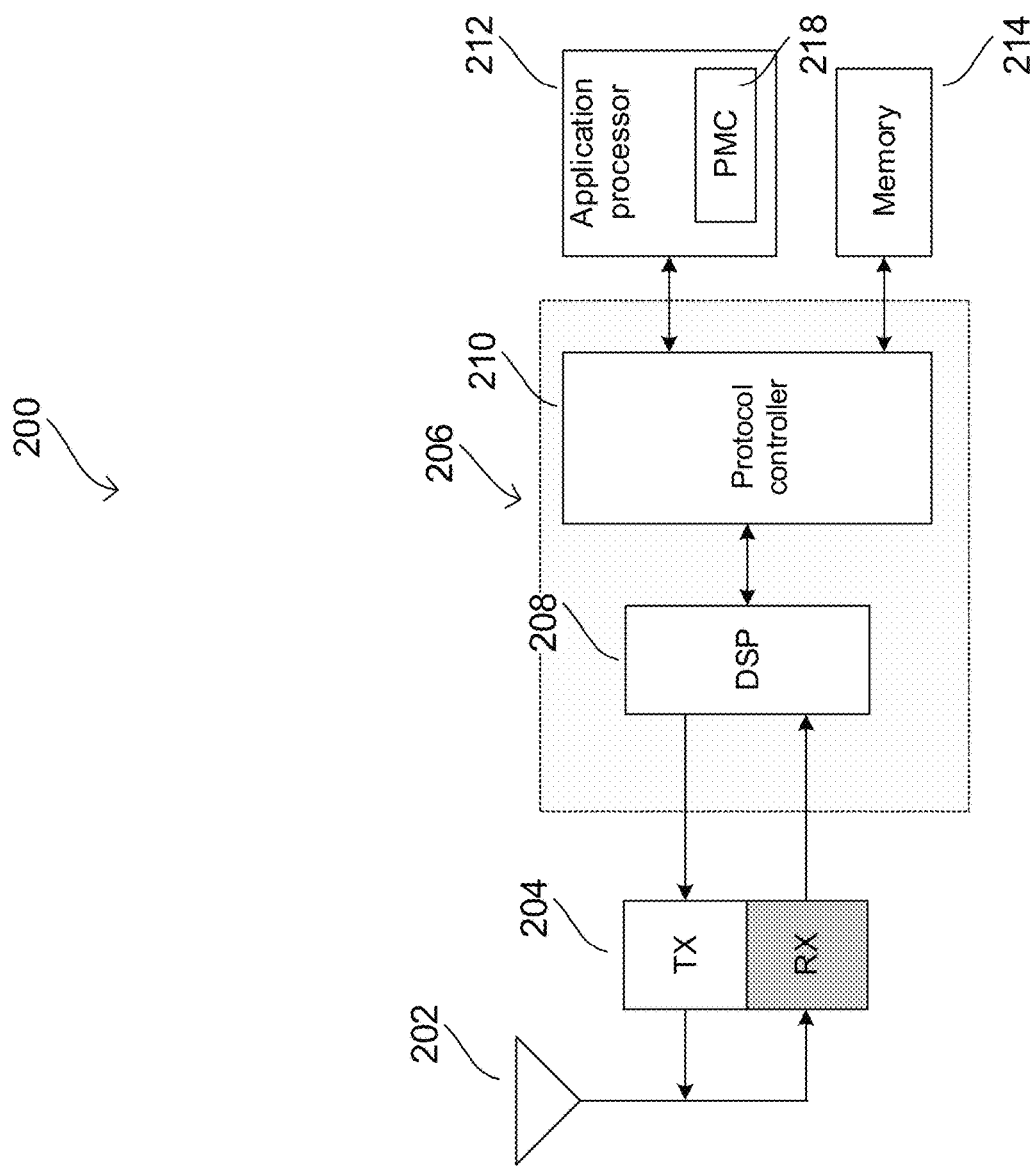
FIG. 2 shows an exemplary internal configuration of a terminal device.

FIGS. 1 and 2 show a general network and device architecture for wireless communications. FIG. 1 shows exemplary radio communication network 100, which may include terminal devices 102 and 104 and network access nodes 110 and 120. Radio communication network 100 may communicate with terminal devices 102 and 104 via network access nodes 110 and 120 over a radio access network. Although certain examples described herein may refer to a particular radio access network context (e.g., LTE, UMTS, GSM, other 3rd Generation Partnership Project (3GPP) networks, WLAN/Wi-Fi, Bluetooth®, 5G NR, mmWave, WiGig, etc.), these examples are illustrative and may be readily applied to any other type or configuration of radio access network. The number of network access nodes and terminal devices in radio communication network 100 is exemplary and is scalable to any amount.

In an exemplary short-range context, network access node 110 and 120 may be access points (APs, e.g., WLAN or Wi-Fi APs), while terminal device 102 and 104 may be short range terminal devices (e.g., stations (STAs)). Network access nodes 110 and 120 may interface (e.g., via an internal or external router) with one or more external data networks. In an exemplary cellular context, network access nodes 110 and 120 may be base stations (e.g., eNodeBs, NodeBs, Base Transceiver Stations (BTSs), gNodeBs, or any other type of base station), while terminal devices 102 and 104 may be cellular terminal devices (e.g., Mobile Stations (MSs), User Equipments (UEs), or any type of cellular terminal device). Network access nodes 110 and 120 may therefore interface (e.g., via backhaul interfaces) with a cellular core network such as an Evolved Packet Core (EPC, for LTE), Core Network (CN, for UMTS), or other cellular core networks, which may also be considered part of radio communication network 100. The cellular core network may interface with one or more external data networks.

Network access nodes 110 and 120 (and, optionally, other network access nodes of radio communication network 100 not explicitly shown in FIG. 1) may accordingly provide a radio access network to terminal devices 102 and 104 (and, optionally, other terminal devices of radio communication network 100 not explicitly shown in FIG. 1). In an exemplary short-range context, the radio access network provided by network access nodes 110 and 120 may provide access to internal data networks (e.g., for transferring data between terminal devices connected to radio communication network 100) and external data networks (e.g., data networks providing voice, text, multimedia (audio, video, image), and other Internet and application data). In an exemplary cellular context, the radio access network provided by network access nodes 110 and 120 may enable terminal devices 102 and 104 to wirelessly access the core network via radio communications. The core network may provide switching, routing, and transmission, for traffic data related to terminal devices 102 and 104, and may further provide access to various internal data networks (e.g., control nodes, routing nodes that transfer information between other terminal devices on radio communication network 100, etc.) and external data networks (e.g., data networks providing voice, text, multimedia (audio, video, image), and other Internet and application data).

The radio access network and core network of radio communication network 100 may be governed by communication protocols that can vary depending on the specifics of radio communication network 100. Such communication protocols may define the scheduling, formatting, and routing of both user and control data traffic through radio communication network 100, which includes the transmission and reception of such data through both the radio access and core network domains of radio communication network 100. Accordingly, terminal devices 102 and 104 and network access nodes 110 and 120 may follow the defined communication protocols to transmit and receive data over the radio access network domain of radio communication network 100, while the core network may follow the defined communication protocols to route data within and outside of the core network. Exemplary communication protocols include LTE, UMTS, GSM, WiMAX, Bluetooth®, Wi-Fi, mmWave, 5G NR, and the like, any of which may be applicable to radio communication network 100.

FIG. 2 shows an exemplary internal configuration of terminal device 200, which may include antenna system 202, radio frequency (RF) transceiver 204, baseband modem 206 (including digital signal processor 208 and protocol controller 210), application processor 212, and memory 214. Terminal device 200 may be any one of terminal device 102 or 104. Although not explicitly shown in FIG. 2, terminal device 200 may include one or more additional hardware and/or components, software such as processors/microprocessors, controllers/microcontrollers, other specialty or generic hardware/processors/circuits, peripheral device(s), memory, power supply, external device interface(s), subscriber identity module(s) (SIMs), user input/output devices (display(s), keypad(s), touchscreen(s), speaker(s), external button(s), camera(s), microphone(s), etc.), or other related components.

Terminal device 102 may transmit and receive radio signals on one or more radio access networks. Baseband modem 206 may direct such communication functionality of terminal device 200 according to the communication protocols associated with each radio access network, and may execute control over antenna system 202 and RF transceiver 204 to transmit and receive radio signals according to the formatting and scheduling parameters defined by each communication protocol. Although various practical designs may include separate communication components for each supported radio communication technology (e.g., a separate antenna, RF transceiver, digital signal processor, and controller), for purposes of conciseness the configuration of terminal device 200 shown in FIG. 2 depicts only a single instance of such components.

Terminal device 200 may transmit and receive wireless signals with antenna system 202. Antenna system 202 may be a single antenna or may include one or more antenna arrays that each include multiple antenna elements. For example, antenna system 202 may include an antenna array at the top of terminal device 200 and a second antenna array at the bottom of terminal device 200. Antenna system 202 may additionally include analog antenna combination and/or beamforming circuitry. In the receive (RX) path, RF transceiver 204 may receive analog radio frequency signals from antenna system 202 and perform analog and digital RF front-end processing on the analog radio frequency signals to produce digital baseband samples (e.g., In-Phase/Quadrature (IQ) samples) to provide to baseband modem 206. RF transceiver 204 may include analog and digital reception components including amplifiers (e.g., Low Noise Amplifiers (LNAs)), filters, RF demodulators (e.g., RF IQ demodulators)), and analog-to-digital converters (ADCs), which RF transceiver 204 may utilize to convert the received radio frequency signals to digital baseband samples. In the transmit (TX) path, RF transceiver 204 may receive digital baseband samples from baseband modem 206 and perform analog and digital RF front-end processing on the digital baseband samples to produce analog radio frequency signals to provide to antenna system 202 for wireless transmission. RF transceiver 204 may thus include analog and digital transmission components including amplifiers (e.g., Power Amplifiers (PAs), filters, RF modulators (e.g., RF IQ modulators), and digital-to-analog converters (DACs), which RF transceiver 204 may utilize to mix the digital baseband samples received from baseband modem 206 and produce the analog radio frequency signals for wireless transmission by antenna system 202. Baseband modem 206 may control the radio transmission and reception of RF transceiver 204, including specifying the transmit and receive radio frequencies for operation of RF transceiver 204.

As shown in FIG. 2, baseband modem 206 may include digital signal processor 208, which may perform physical layer (PHY, Layer 1) transmission and reception processing to, in the transmit path, prepare outgoing transmit data provided by protocol controller 210 for transmission via RF transceiver 204, and, in the receive path, prepare incoming received data provided by RF transceiver 204 for processing by protocol controller 210. Digital signal processor 208 may be configured to perform one or more of error detection, forward error correction encoding/decoding, channel coding and interleaving, channel modulation/demodulation, physical channel mapping, radio measurement and search, frequency and time synchronization, antenna diversity processing, power control and weighting, rate matching/dematching, retransmission processing, interference cancelation, and any other physical layer processing functions. Digital signal processor 208 may be structurally realized as hardware components (e.g., as one or more digitally-configured hardware circuits or FPGAs), software-defined components (e.g., one or more processors configured to execute program code defining arithmetic, control, and I/O instructions (e.g., software and/or firmware) stored in a non-transitory computer-readable storage medium), or as a combination of hardware and software components. Digital signal processor 208 may include one or more processors configured to retrieve and execute program code that defines control and processing logic for physical layer processing operations. Digital signal processor 208 may execute processing functions with software via the execution of executable instructions. Digital signal processor 208 may include one or more dedicated hardware circuits (e.g., ASICs, FPGAs, and other hardware) that are digitally configured to specifically execute processing functions, where the one or more processors of digital signal processor 208 may offload certain processing tasks to these dedicated hardware circuits, which are known as hardware accelerators. Exemplary hardware accelerators can include Fast Fourier Transform (FFT) circuits and encoder/decoder circuits. The processor and hardware accelerator components of digital signal processor 208 may be realized as a coupled integrated circuit.

Terminal device 200 may be configured to operate according to one or more radio communication technologies. Digital signal processor 208 may be responsible for lower-layer processing functions (e.g. Layer 1/PHY) of the radio communication technologies, while protocol controller 210 may be responsible for upper-layer protocol stack functions (e.g., Data Link Layer/Layer 2 and/or Network Layer/Layer 3). Protocol controller 210 may thus be responsible for controlling the radio communication components of terminal device 200 (antenna system 202, RF transceiver 204, and digital signal processor 208) in accordance with the communication protocols of each supported radio communication technology, and accordingly may represent the Access Stratum and Non-Access Stratum (NAS) (also encompassing Layer 2 and Layer 3) of each supported radio communication technology. Protocol controller 210 may be structurally embodied as a protocol processor configured to execute protocol stack software (retrieved from a controller memory) and subsequently control the radio communication components of terminal device 200 to transmit and receive communication signals in accordance with the corresponding protocol stack control logic defined in the protocol software. Protocol controller 210 may include one or more processors configured to retrieve and execute program code that defines the upper-layer protocol stack logic for one or more radio communication technologies, which can include Data Link Layer/Layer 2 and Network Layer/Layer 3 functions. Protocol controller 210 may be configured to perform both user-plane and control-plane functions to facilitate the transfer of application layer data to and from radio terminal device 200 according to the specific protocols of the supported radio communication technology. User-plane functions can include header compression and encapsulation, security, error checking and correction, channel multiplexing, scheduling and priority, while control-plane functions may include setup and maintenance of radio bearers. The program code retrieved and executed by protocol controller 210 may include executable instructions that define the logic of such functions.

Terminal device 200 may also include application processor 212 and memory 214. Application processor 212 may be a CPU, and may be configured to handle the layers above the protocol stack, including the transport and application layers. Application processor 212 may be configured to execute various applications and/or programs of terminal device 200 at an application layer of terminal device 200, such as an operating system (OS), a user interface (UI) for supporting user interaction with terminal device 200, and/or various user applications. The application processor may interface with baseband modem 206 and act as a source (in the transmit path) and a sink (in the receive path) for user data, such as voice data, audio/video/image data, messaging data, application data, basic Internet/web access data, etc. In the transmit path, protocol controller 210 may therefore receive and process outgoing data provided by application processor 212 according to the layer-specific functions of the protocol stack, and provide the resulting data to digital signal processor 208. Digital signal processor 208 may then perform physical layer processing on the received data to produce digital baseband samples, which digital signal processor may provide to RF transceiver 204. RF transceiver 204 may then process the digital baseband samples to convert the digital baseband samples to analog RF signals, which RF transceiver 204 may wirelessly transmit via antenna system 202. In the receive path, RF transceiver 204 may receive analog RF signals from antenna system 202 and process the analog RF signals to obtain digital baseband samples. RF transceiver 204 may provide the digital baseband samples to digital signal processor 208, which may perform physical layer processing on the digital baseband samples. Digital signal processor 208 may then provide the resulting data to protocol controller 210, which may process the resulting data according to the layer-specific functions of the protocol stack and provide the resulting incoming data to application processor 212. Application processor 212 may then handle the incoming data at the application layer, which can include execution of one or more application programs with the data and/or presentation of the data to a user via a user interface.

Memory 214 may be a memory circuitry or storage element of terminal device 200, such as a hard drive or another such permanent memory device. Although not explicitly depicted in FIG. 2, the various other components of terminal device 200 shown in FIG. 2 may additionally each include integrated permanent and non-permanent memory components, such as for storing software program code, buffering data, etc.

In accordance with some radio communication networks, terminal devices 102 and 104 may execute mobility procedures to connect to, disconnect from, and switch between available network access nodes of the radio access network of radio communication network 100. As each network access node of radio communication network 100 may have a specific coverage area, terminal devices 102 and 104 may be configured to select and re-select available network access nodes in order to maintain a strong radio access connection with the radio access network of radio communication network 100. For example, terminal device 102 may establish a radio access connection with network access node 110 while terminal device 104 may establish a radio access connection with network access node 120. If the current radio access connection degrades, terminal devices 102 or 104 may seek a new radio access connection with another network access node of radio communication network 100; for example, terminal device 104 may move from the coverage area of network access node 120 into the coverage area of network access node 110. As a result, the radio access connection with network access node 120 may degrade, which terminal device 104 may detect via radio measurements such as signal strength or signal quality measurements of network access node 120. Depending on the mobility procedures defined in the appropriate network protocols for radio communication network 100, terminal device 104 may seek a new radio access connection (which may be, for example, triggered at terminal device 104 or by the radio access network), such as by performing radio measurements on neighboring network access nodes to determine whether any neighboring network access nodes can provide a suitable radio access connection. As terminal device 104 may have moved into the coverage area of network access node 110, terminal device 104 may identify network access node 110 (which may be selected by terminal device 104 or selected by the radio access network) and transfer to a new radio access connection with network access node 110. Such mobility procedures, including radio measurements, cell selection/reselection, and handover are established in the various network protocols and may be employed by terminal devices and the radio access network in order to maintain strong radio access connections between each terminal device and the radio access network across any number of different radio access network scenarios.

This disclosure provides various devices and methods for enhancing the average power efficiency of linear PAs within a wireless communication system. For example, this disclosure provides various devices and methods for adjusting power consumption based on signal power levels by turning on or off unit based linear PA cells.

During operation of a wireless communication device, the actual required power output of PAs of the wireless communication device may be much lower than the peak power of the PAs. If the linear power output is always set to operate at a maximum power out, the power consumption may be more than necessary for the given scenario.

Figure 3:
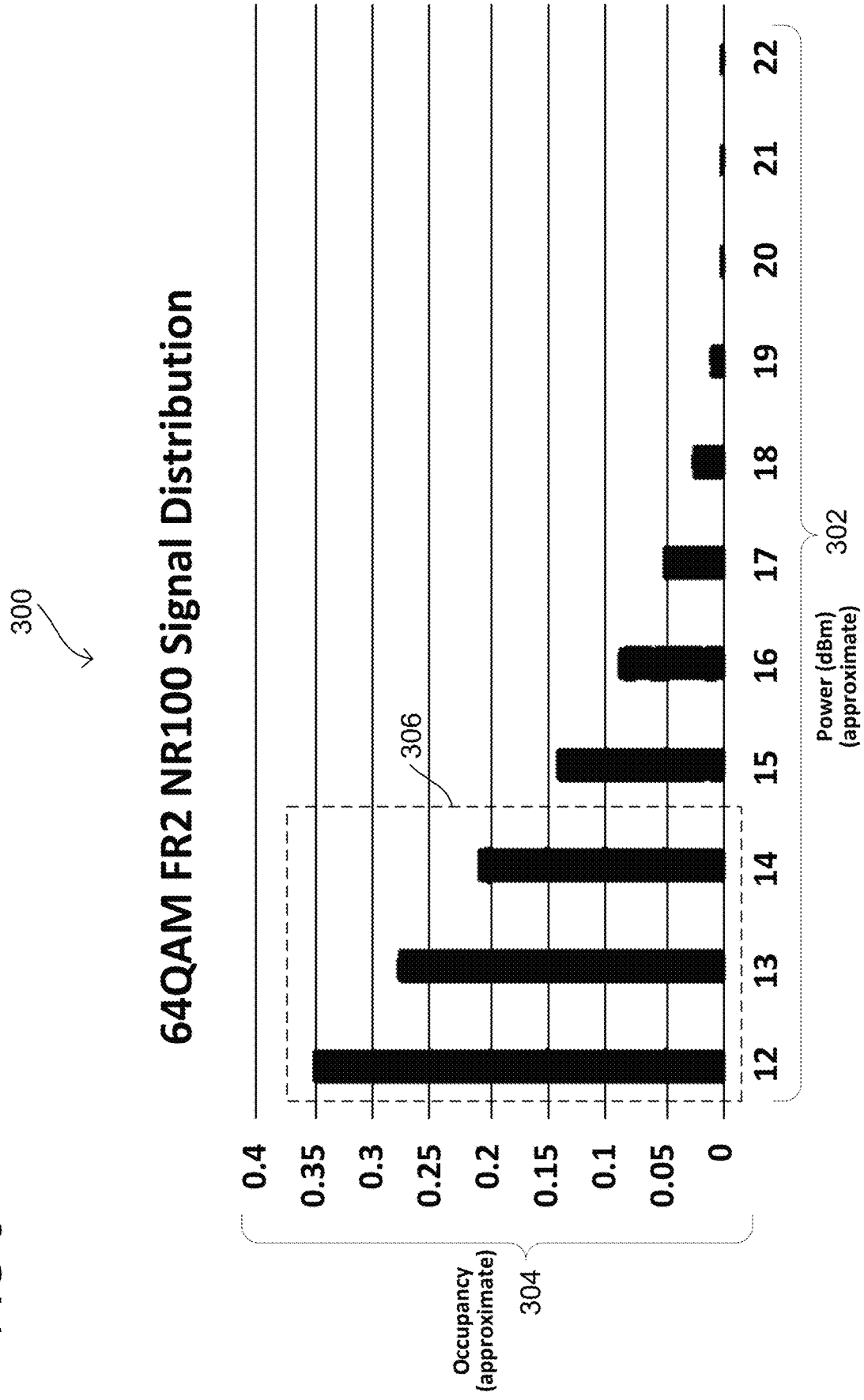
FIG. 3 shows an exemplary distribution of power out of a linear power amplifier for an OFDM input waveform.

FIG. 3 shows a power level occupancy distribution 300 of an approximate occupancy 304 (normalized to about 1) against power consumption 302 for a modulation scheme using 64 quadrature amplitude modulation (QAM). Spectrally efficient modulation schemes usually operate at a large peak-to-average-power-ratio (PAPR). Distribution 300 shows an approximate power occupancy histogram of the instantaneous power. As shown in FIG. 3, the modulation scheme has a peak power output of about 22 decibel milliwatts (dBm), however it is expected to operate at a power consumption 302 of about 14 dBm or less for about 80% to 85% of the time 306. If power consumption remains static irrespective of power output, the linear PA is inefficient.

Figure 4:
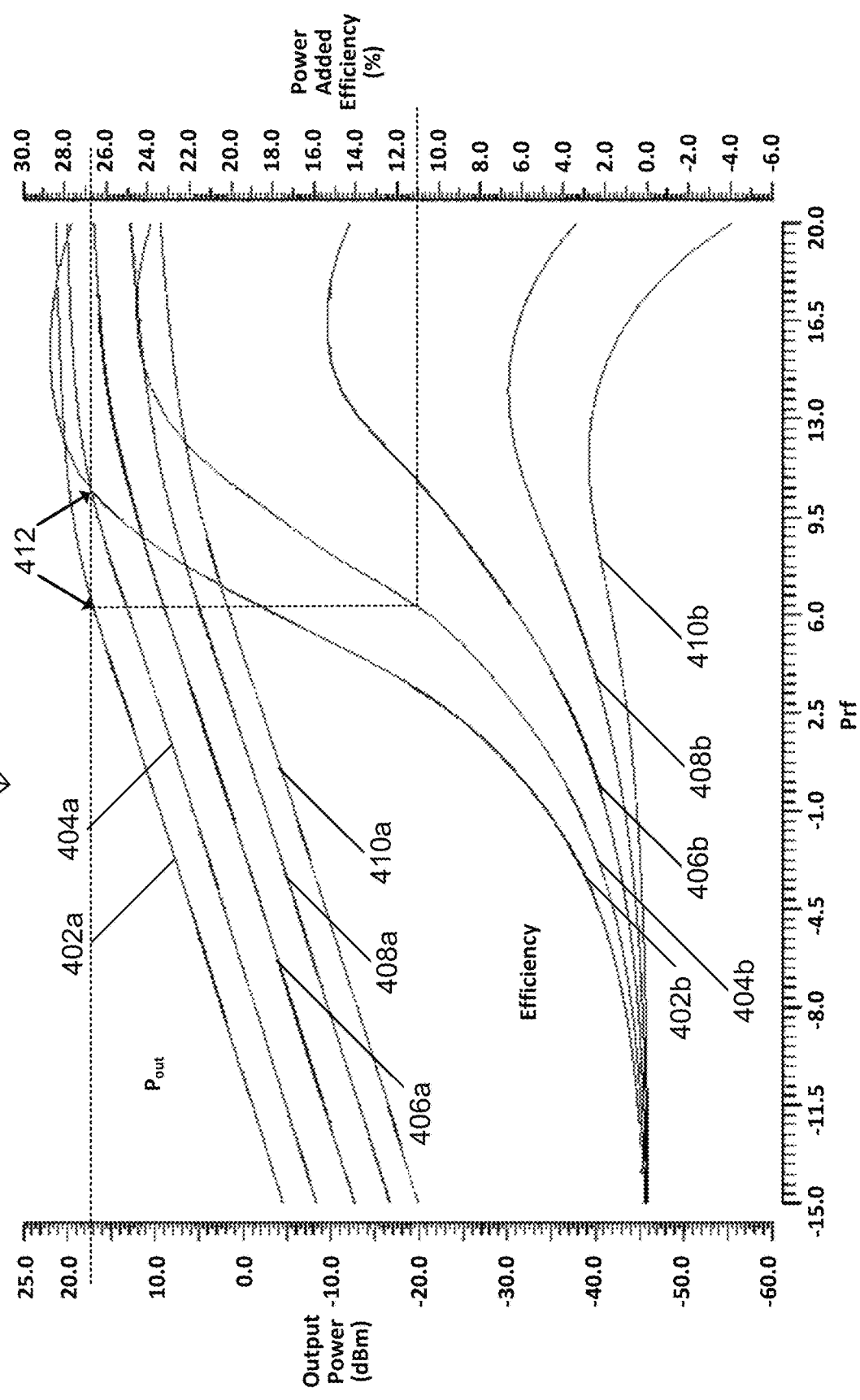
FIG. 4 shows an exemplary comparison between power out and average efficiency of power profiles of a power amplifier.

FIG. 4 shows efficiency profiles of a linear PA for five different profiles. Each profile is associated with a signal output power 402*a*, 404*a*, 406*a*, 408*a*, and 410*a*. Additionally, each profile is associated with power added efficiency (PAE) 402*b*, 404*b*, 406*b*, 408*b*, and 410*b*. Thus, output power 402*a* and efficiency 402*b* correspond to an efficiency profile; output power 404*a* and efficiency 404*b* correspond to another efficiency profile; output power 406*a* and efficiency 406*b* correspond to another efficiency profile; output power 408*a* and efficiency 408*b* correspond to another efficiency profile; and output power 410*a* and efficiency 410*b* correspond to another efficiency profile. FIG. 4 shows a chart 400 comparing the output signal power (Pout) vs power added efficiency (PAE) for each profile of an exemplary PA. As shown in FIG. 4, the PAE is highest when the PA is operating at peak power, but can fall significantly when producing signals at requiring less power than peak power. Therefore, average efficiency is dictated by the efficiency at the average power. The root cause of the efficiency degradation lies in the fact that PA consumes the same (class-A) or almost the same (Class AB) static power irrespective of output power. The techniques described in this disclosure aim to reduce static power consumption proportionally for reduced Pout.

As shown in FIG. 4, some profiles are more efficient than others when generating the same output power. For example, power output 402*a* and 404*a* can generate the same output power 412 (approximately 17 dBm). However, at this output power, efficiency 402*b* (approximately 27.0%) is greater than efficiency 404*b* (approximately 11.0%). Therefore, in terms of power consumption, it would be advantageous to use the profile with power output 402*a* and efficiency 402*b* to generate a 17 dBm signal.

A wireless communication device may be configured with different RF output power profiles based on signal transmission requirements to reduce overall static power consumption. Individual PA unit cells may be turned off (disabled) or on (enabled) based on the PA input signal level. For example, a wireless communication device may be configured for a peak RF output power of 22 dBm. If the required output power is 14 dBm, a subset of PA unit cells may be turned off to reduce static power consumption. The wireless communication device may be configured with 5 different profiles for ranges of output power. For example, profiles 1 through 5 may be configured for 0-2, 3-4, 5-8, 9-16, 14-22 dBm ranges respectively. It should be noted that the wireless communication device may be configured for any number N profiles. Each profile may be configured to turn on or off a subset of unit cells to meet the RF power out dBm requirements for each profile range.

Figure 5A:
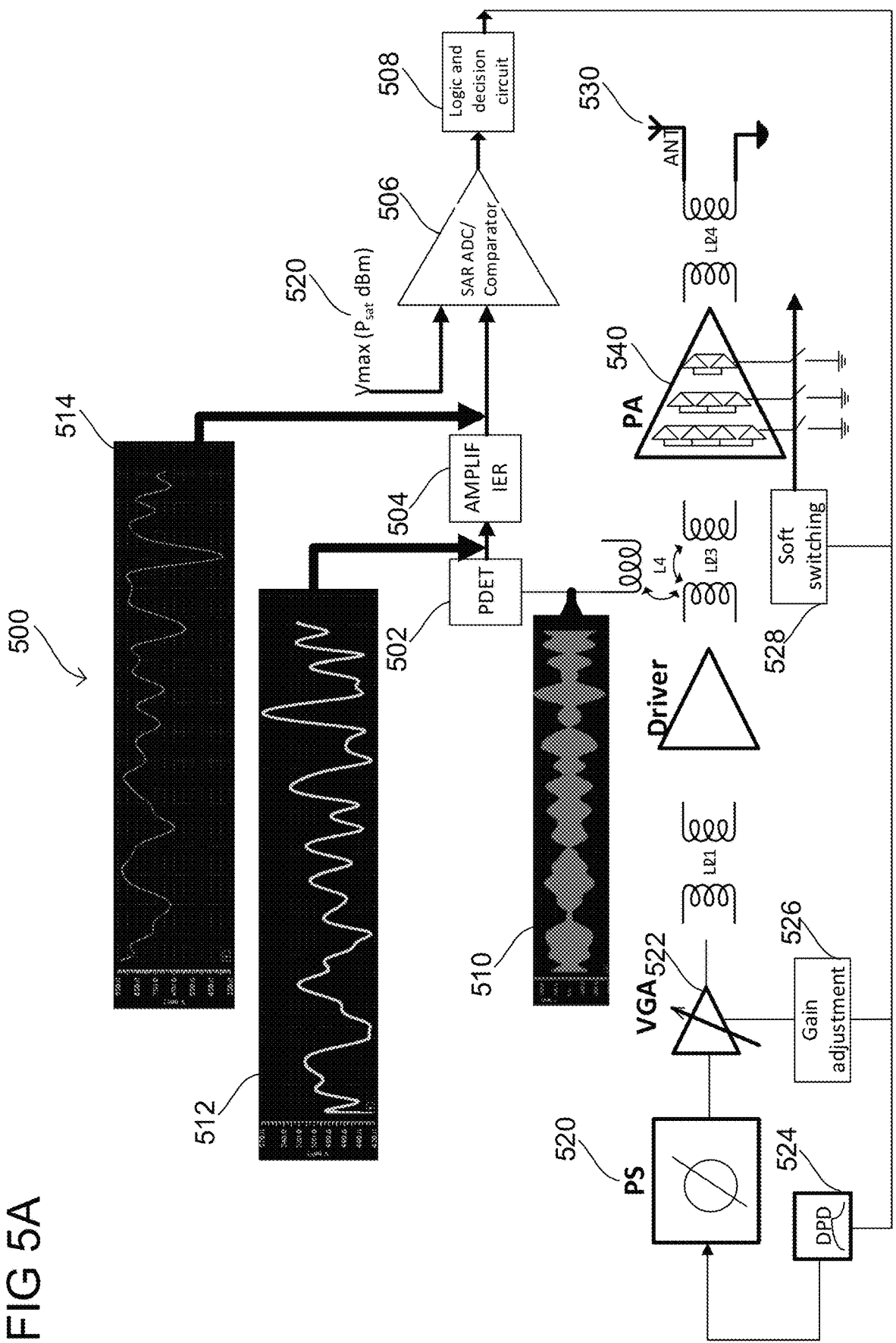
FIG. 5A shows an exemplary wireless communication device for power efficiency.

FIG. 5A shows an exemplary wireless communication device 500. Wireless communication device may include power detector 502. Power detector 502 may be configured to receive a modulated input signal 510, such as a high frequency signal. Power detector 502 may be an envelope detector configured to determine the envelope 512 of the modulated input signal 510. The envelope 512 may include the peak amplitude of the modulated input signal 510. Amplifier 504 may determine a required transmission power 514 for an RF output signal based on the envelope 512 determined by power detector 502. Comparator 506 may compare the required transmission power 514 with the maximum output power 520 of device 500. If the required transmission power 514 is greater than or equal to the maximum output power 520, logic circuit 508 determines that all PA devices or unit cells must be enabled. If the required transmission power 514 is less than the maximum output power, logic circuit 508 may determine an appropriate power profile for the required transmission power 514.

For example, logic circuit 508 may control PA 540 based on the determined power profile. The logic circuit 508 may disable a subset of PA 540 devices to reduce static power consumption and still meet the required transmission power. Logic circuit 508 may be implemented in application processor 212 of FIG. 2. Logic circuit 508 may implement an algorithm to determine which PA devices to enable or disable. For example, algorithm 600 described in FIG. 6 below.

Alternatively, power detector 502 may determine envelope 512 by determining a number of resource blocks (RB) of input signal 510. For example, the modulated input signal may be processed to determine data symbols in the physical downlink shared channel (PDSCH). The required transmission power may be based on the number of RBs per downlink user data symbol as described in FIG. 7 below.

Determining an envelope by placing power detector 502 early in the RF chain reduces delay. However, input power based on an envelope detected early in the RF chain may ignore gain variations later in the RF chain. As a result, a power headroom may be added to the input power to account for gain variations. For example, one approach may add a 3 dB power headroom so that the PA output is not saturated for sudden variations in envelope amplitude. Additionally, a statistical model of the envelope may also be used to determine the power headroom and reduce the risk of losing information.

Wireless communication device 500 may optionally include phase shifter 520 to generate phases of a modulated signal. Phase shifter 520 may be a phase locked loop configured to generate phases of a modulated signal used to control PA 540. Phase shifter 520 may be connected to voltage gain amplifier (VGA) 522 to generate voltage gain 526 between the modulated signal and the generated phases. Additionally, digital predistortion 524 may be included to linearize the multiple PA devices of PA 540. Switching controller 528 may control the PA devices according to an output of logic circuit 508.

Wireless communication device 500 may also optionally include antenna 530 connected to PA 540. Antenna 530 may be an antenna array. PA 540 may be connected to antenna 530 through a transformer and forward the PA output to antenna 530.

Figure 5B:
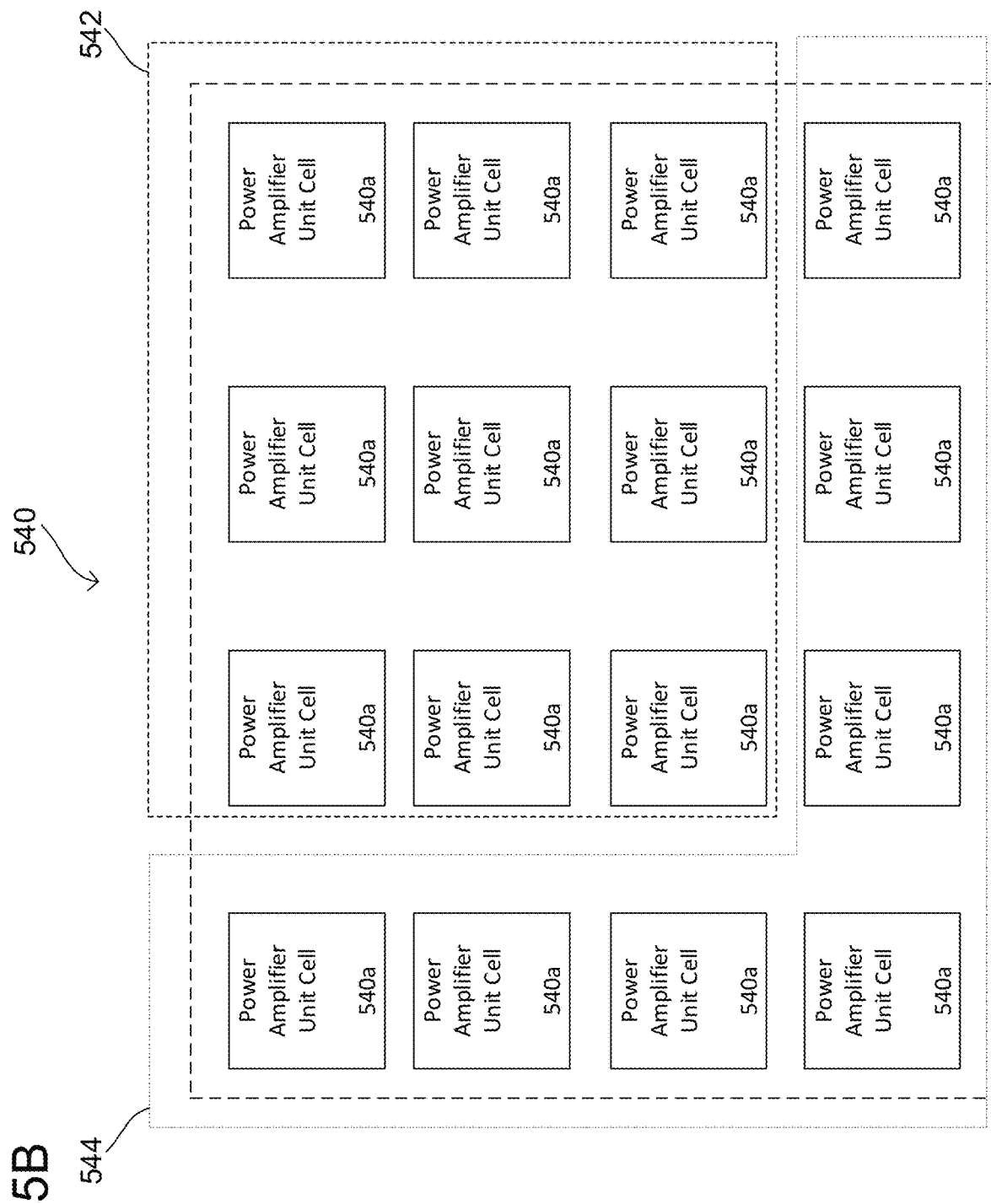
FIG. 5B shows an exemplary power amplifier for a wireless communication device.

FIG. 5B shows an exemplary power amplifier 540 of FIG. 5A. The PA may include a plurality of PA devices 540a. PA devices 540a may be dynamically enabled or disabled based on power profiles. For example, PA 540 may be configured to generate a maximum signal strength of 16 dBm, wherein each PA device 540a is configured to generate a signal strength of 1 dBm. The maximum signal strength is the highest output power signal when all PAs 540a are enabled. Logic circuit 508 may determine that the required signal strength is less than the maximum signal strength of 16 dBm based on output from power detector 502. Logic circuit 508 may select a power profile configured for the lower signal strength. For example, if the lower signal strength is 9 dBm, logic circuit 508 may determine a power profile configured to generate a 9 dBm signal strength. The power profile may be associated with ensuring only subset 542 of the plurality of unit cell PAs 540a is enabled and complementary subset 544 of unit cell PAs 540a is disabled. Logic circuit may generate an instruction to disable the PAs 540a in complementary subset 544 and enable PAs 540a in subset 542. For example, the instruction may include opening a switch of PAs 540a in subset 544 to disable them. The disabled PAs no longer consume power. It should be noted that any combination of unit cells may be used in PA 540, for example unit cells described in FIGS. 8, 9, and 10 below. Methods for disabling PAs 540 are further described with respect to FIGS. 8, 9, and 10 below. It should be noted that the configuration in FIG. 5B is for illustrative purposes only.

Figure 6:
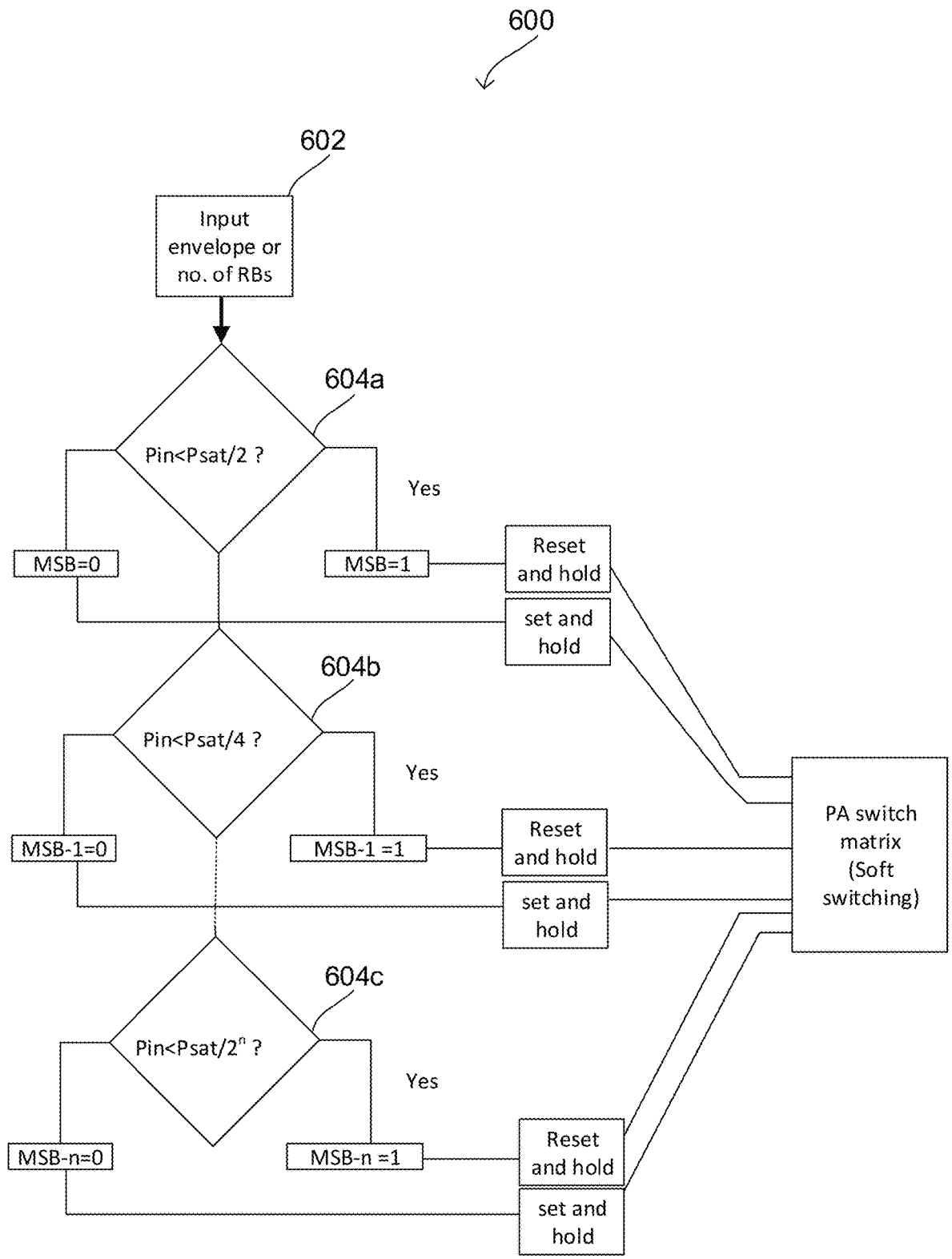
FIG. 6 shows an exemplary method of switching power amplifiers.

FIG. 6 shows algorithm 600 to select PA device states. Control logic 508 may implement algorithm 600. The output of algorithm 600 may be provided to a logic circuit to control the PA devices. Input 602 may be the input envelope or the number of RB blocks of the modulated signal. An input power of the modulated signal is based on input 602 and forwarded to steps 604a, 604b, and 604c. At steps 604a, 604b, and 604c the input power is compared to a multiple of saturated output power (Psat) or peak power to determine a power profile. An instruction to dynamically enable or disable a PA device is generated based on the power profile. The instructions may be sent to a control logic circuit to enable or disable PA devices based on the instruction. A wireless communication device does not require a high resolution analog to digital converter (ADC) if it is not unary weighted. In this case, a binary weighted array may only result in one bit being high while other bits are low. Therefore, a comparator, such as comparator 506 of FIG. 5, is sufficient. However, this architecture may apply to binary and unary slices or a combination of both.

Figure 7:
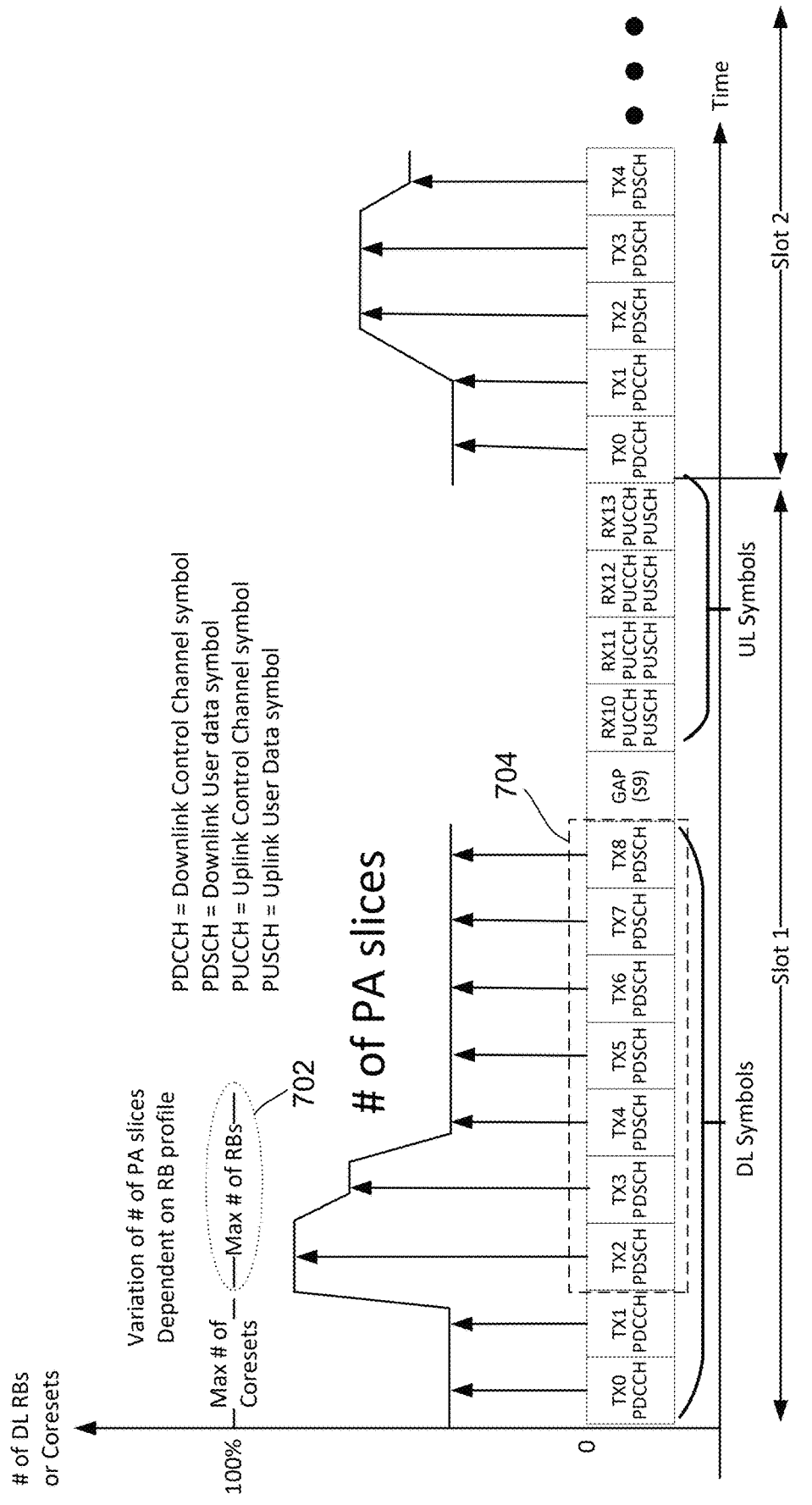
FIG. 7 shows an exemplary physical layer of a modulated signal.

FIG. 7 shows an exemplary physical layer 700 of a wireless communication system. The maximum number of RBs 702 indicates the maximum number of resource blocks allocated to user data symbols. For example, a modulated input signal may include multiple user data symbols 704. The modulated input signal may be associated with a maximum number of RBs for the user data symbols 704. If a user data symbol includes the maximum number of resource blocks, it may require a maximum output power. As shown in FIG. 7, user data symbol TX2 includes more RBs than user data symbol TX3 and user data symbol TX3 includes more RBs than user data symbol TX4. The required transmission power may be based on the determined resource blocks associated with the user data symbols. Therefore, when processing a physical layer 700 of a modulated input signal, the output power may be determined based on the resource blocks associated with user data symbol TX2. As the resource blocks decrease, as shown for transitions between user data symbols TX2 to TX3 and TX3 to TX4, the determined output power may decrease, reducing the static power consumption of a wireless communication device. The output power may be determined for every user data symbol.

Figure 8:
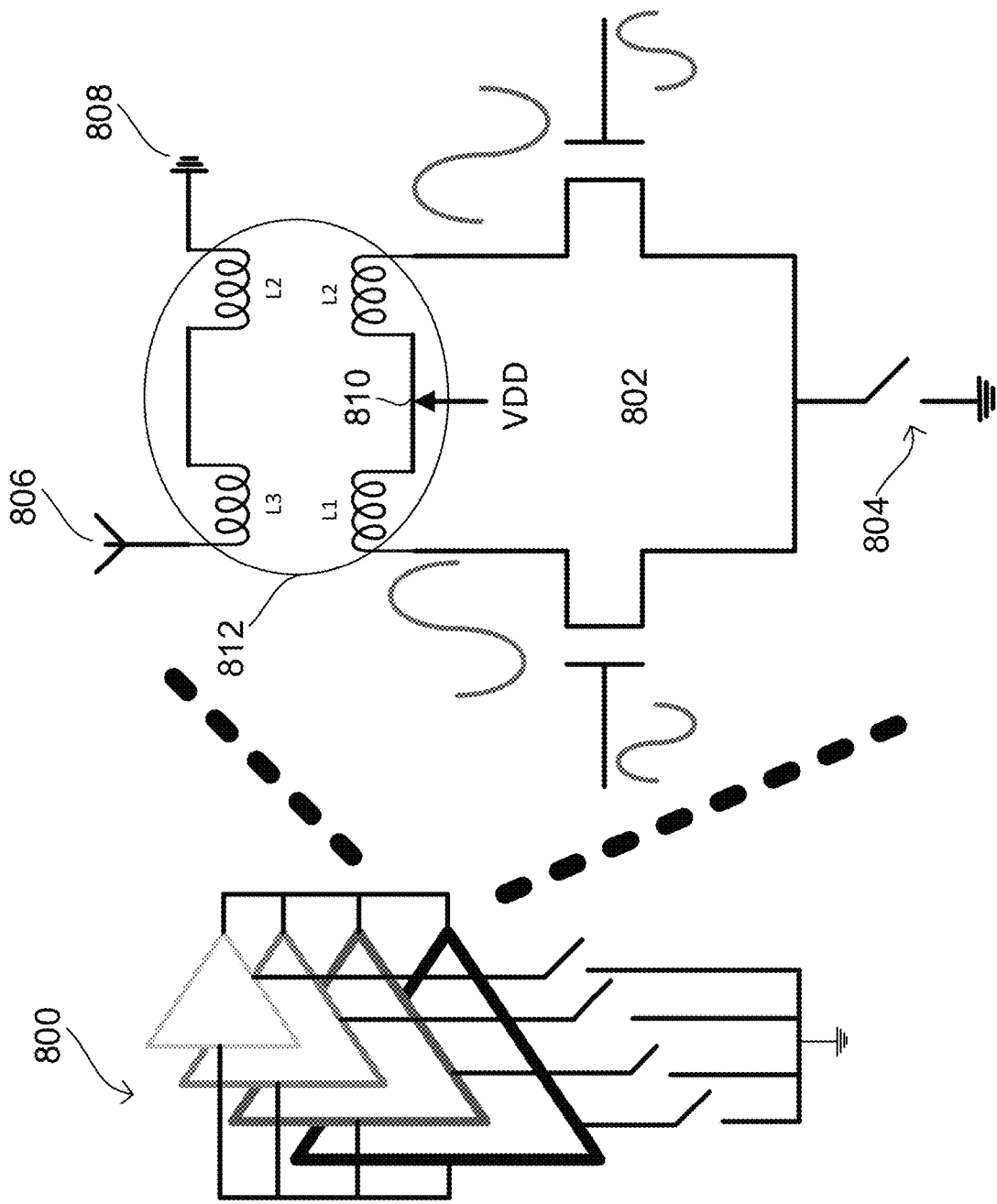
FIG. 8 shows an exemplary single-stack device within a power amplifier.

FIG. 8 shows a power amplifier 800. An exemplary single stack unit cell 802 of PA 800 is shown in more detail. Unit cell 802 may be switched on or off based on transmission requirements. The single stack unit cell 802 includes a tail switch 804. When tail switch 804 is closed, unit cell 802 is on or enabled. When tail switch 804 is open, unit cell 802 is off or disabled. A switchable PA unit cell, such as unit cell 802, may have a high resolution. Disabling unit cells which are not required may significantly increase the PA's average efficiency. Since transmission power is the main power consumer in mmWave devices such as Femtocells, base stations etc., reducing the number of enabled unit cells can greatly reduce total power consumption. Reduction of power consumption may greatly improve packaging, thermal reliability, electricity costs, etc.

A control logic may control switch 804 with, for example, instructions as described in FIG. 6. The control logic may receive the required transmission RF power out and determine a power profile based on the transmission requirement. The control logic may then open or close switch 804 based on the determined power profile.

If the control logic closes switch 804, single stack unit cell 802 is enabled. Enabled unit cell 802 receives a modulated radio frequency signal for amplification and a power source 810 at an input terminal(s). Unit cell 802 may be connected to antenna element 806 through transformer 812. Transformer 812 may forward a unit cell 802 output to antenna 806. Antenna 806 may be part of an antenna array. Transformer 812 may also be connected to ground 808 and control the voltage forwarded to antenna 806.

Figure 9:
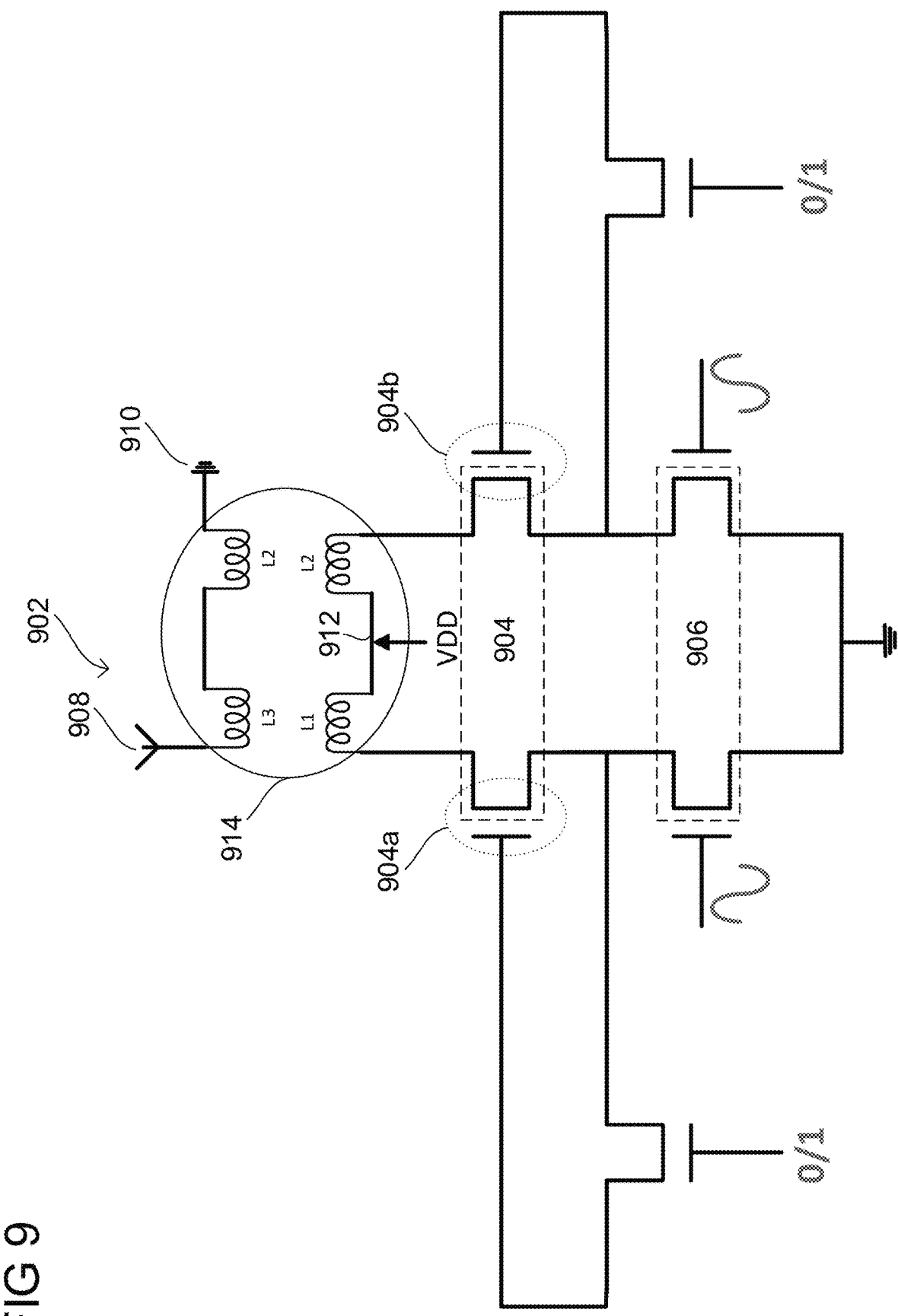
FIG. 9 shows an exemplary double-stack device within a power amplifier.

FIG. 9 shows an exemplary double stack PA unit cell 902. PA device 902 may be part of PA 800 of FIG. 8. Double stack device 902 may include top PA device 904 and bottom PA device 906. The control logic may receive the required transmission RF power out and determine a power profile based on the transmission requirement. For example, the control logic may then enable or disable top PA device 904 based on the determined power profile. Top PA device 904 may be disabled by injecting a voltage equal to a threshold voltage of gates 904a and 904b.

It should be noted that either the top PA device 904 or the bottom PA device 906 may be disabled as previously described.

If the control logic disables top device 904 of double stack PA device 902, bottom device 906 may be enabled. PA device 902 receives a modulated radio frequency signal for amplification and a power source 912 at an input terminal(s).

Enabled PA device 906 may process the received signal and power source. PA device 902 may be connected to antenna element 908 through transformer 914. Transformer 914 may forward a PA device 902 output to antenna 908. Antenna 908 may be part of an antenna array. Transformer 914 may also be connected to ground 910 and control the voltage forwarded to antenna 908. If both PA devices 904 and 906 are enabled, transformer 914 may combine the outputs of PA devices 904 and 906 and forward the combination to antenna 908.

Figure 10:
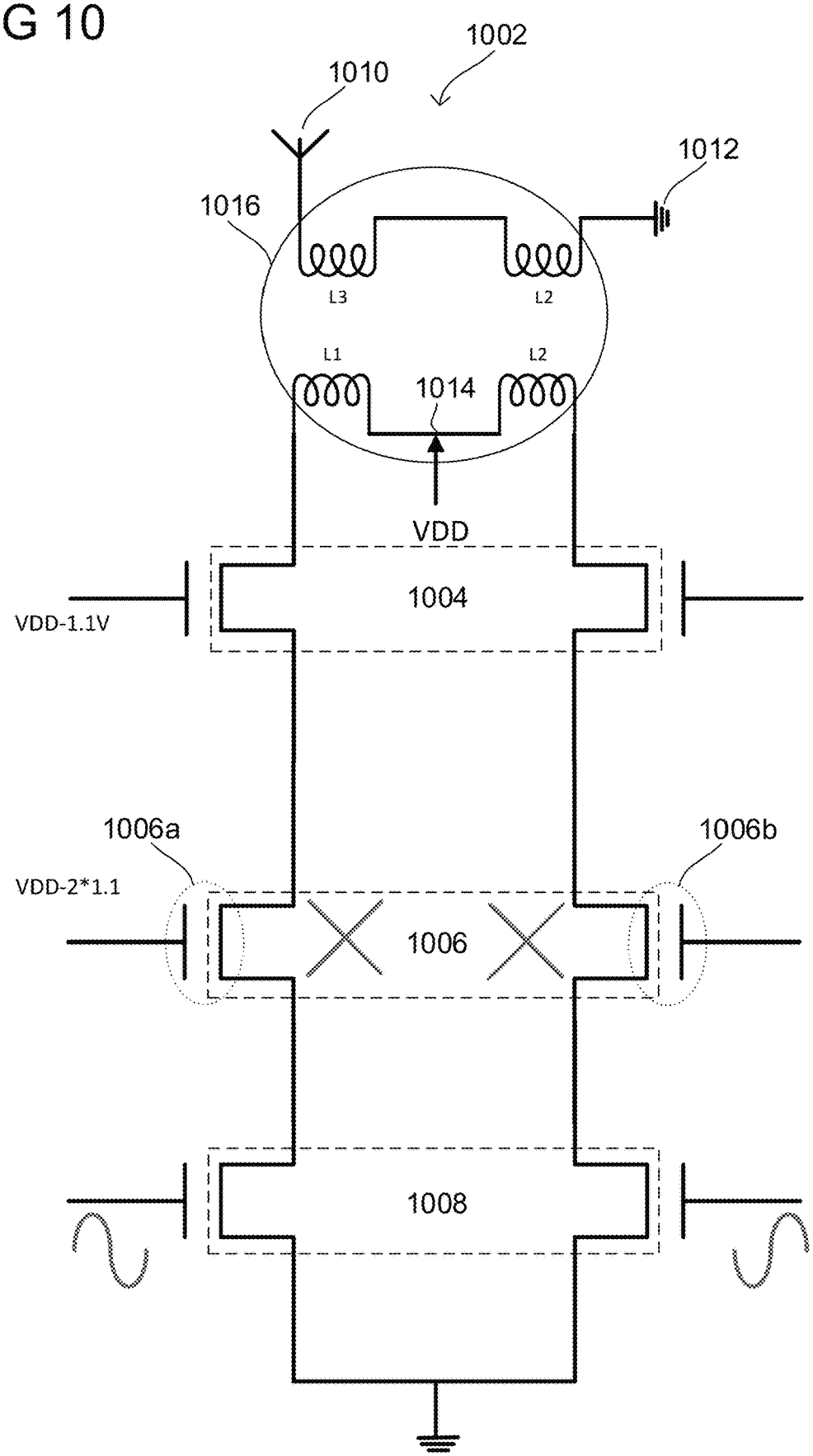
FIG. 10 shows an exemplary multi-stack device within a power amplifier.

FIG. 10 shows an exemplary multi stack PA unit cell 1002. Multi stack PA unit cell 1002 may include top PA device 1004, middle PA device 1006, and bottom PA device 1008. The control logic may control unit cell 1002. The control logic may receive the required transmission RF power out and determine a power profile based on the transmission requirement. The control logic may then enable or disable middle PA device 1006 based on the determined power profile. Middle PA device 1006 may be disabled by injecting a voltage equal to a threshold voltage for gates 1006a and 1006b.

Middle device 1006 may be disabled while complying with max drain to source voltage ($V_{DS}$) across each PA device 1004, 1006, and 1008.

If the control logic disables PA device 1006 of multi stack unit cell 1002, slices 1004 and 1008 may be enabled. Unit cell 1002 receives a modulated radio frequency signal for amplification and a power source 1014 at an input terminal(s). Enabled PA devices 1004 and 1008 may process the received signal and power source. Unit cell 1002 may be connected to antenna element 1010 through transformer 1016. Transformer 1016 may forward a unit cell 1002 output to antenna 1010. Antenna 1010 may be part of an antenna array. Transformer 1016 may also be connected to ground 1012 and control the voltage forwarded to antenna 1010. If all PA devices 1004, 1006, and 1008 are enabled, transformer 1016 may combine the outputs of PA devices 1004, 1006, and 1008 and forward the combination to antenna 1010.

Turning individual PA unit cells or PA devices off and on depending on the required output signal power, instead of keeping them all on to support a peak power, may reduce power consumption. The number of enabled (turned on) PA devices should be enough to transmit the required power while keeping some margin for sudden variations, within the limits of the bandwidth.

Figure 11:
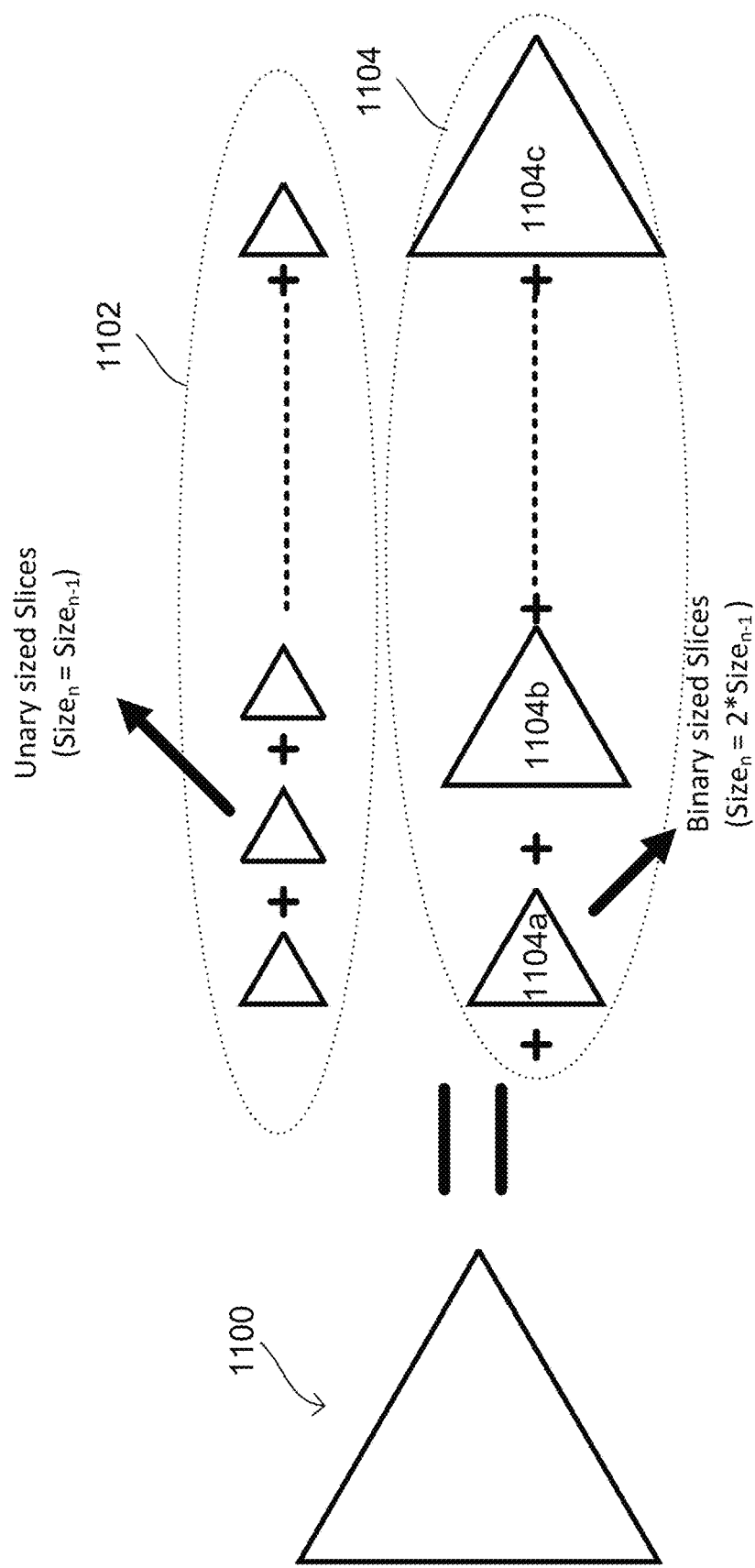
FIG. 11 shows exemplary PA slices within a power amplifier.

FIG. 11 shows exemplary PA slice configurations 1102 and 1104 within a power amplifier 1100. PA 1100 may be configured as any one of PAs 802, 902, or 1002. Slice configuration 1102 may include multiple unary slices, where each of the unary slices are of equal size. Each unary slice may be a PA unit cell. Slice configuration 1104 may include binary slices 1104a, 1104b, and 1104c. Slices 1104a, 1104b, and 1104c increase in size respectively, as shown in FIG. 11. For both slice configurations 1102 and 1104, the cumulative output of the slices equals the output of PA unit cell 1100.

Each PA may be configured to generate a specific output power by enabling or disabling each PA slice (PA device) separately. Each PA device as described in FIGS. 9 and 10 may include one or more slices 1102 or 1104. Each PA slice may be tied to a different power profile to enable or disable the PA slice. Tying each PA slice to a power profile allows for quick accommodations to changes in required output power.

FIG. 12 shows exemplary phases 1202a, 1202b, and 1202c of PA unit cell 1200 within a power amplifier. Each phase may include a single stack, double stack, or multi stack PA unit cell. For example, phase 1202a may include a single stack PA device 802, phase 1202b may include a double stack PA device 902, and phase 1202c may include a multi stack PA device 1002. The cumulative output power of each phase 1202a, 1202b, and 1202c equals the total output power of PA unit cell 1200.

Figure 13:
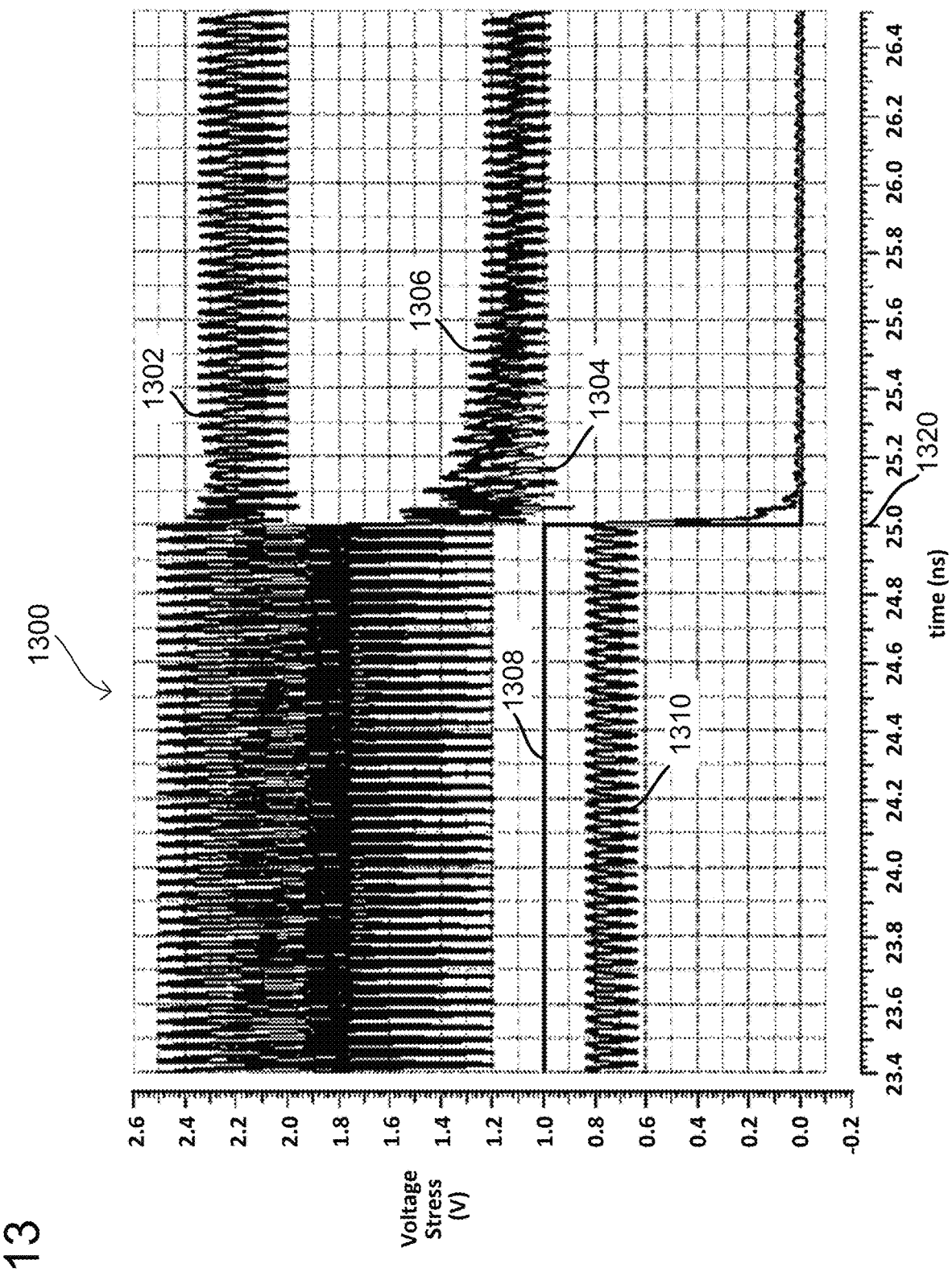
FIG. 13 shows an exemplary voltage stress across a multi-stack device within a power amplifier.

FIG. 13 shows the voltage stress 1300 across each device of a multi stack PA unit cell. For example, PA unit cell 1002 as shown in FIG. 10. FIG. 13 illustrates the voltage stresses 1302, 1304, 1306, 1308, 1310 across PA device components to show that PA devices may be turned on or off safely by controlling gate bias.

Top PA device 1004 of FIG. 10 may express drain voltage stress 1302 and gate voltage stress 1304. Middle PA device 1006 of FIG. 10 may express drain voltage stress 1306, gate voltage stress 1308, and source voltage stress 1310. At time 1320 (25 ns) a voltage equal to the gate voltage of the middle PA device 1006 is injected into middle device gates 1006a and 1006b to turn off the middle device 1006. As shown in FIG. 13, the middle PA device 1006 consumes 0 or close to 0 voltage after being disabled.

Figure 14A:
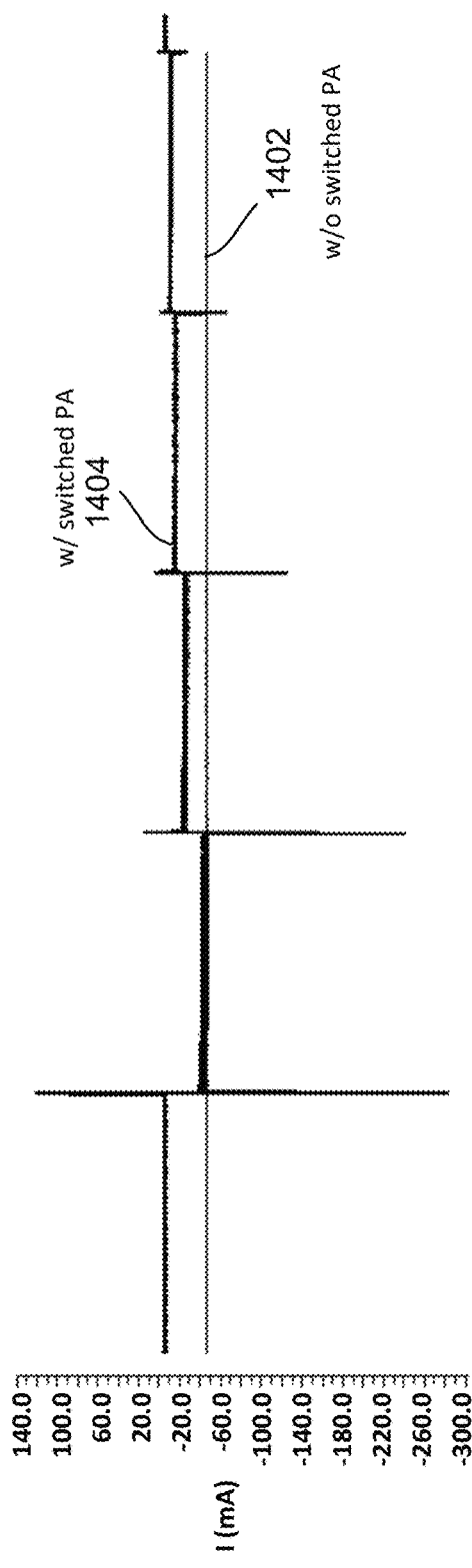
FIG. 14A shows a comparison of power consumption between a switched power amplifier and a non-switched power amplifier of signal as showing in FIG. 14B.

FIG. 14A shows the power consumption for a PA device. For example, PA device 802, 902, or 1002. Line 1404 shows a variable voltage for a switched single stack PA 802 device, such as shown in FIG. 8. Line 1402 shows a constant voltage for a conventional PA regardless of the variations in a modulated input signal. As shown in FIG. 14A, the voltage variations coincide with changes in the input signal modulation.

Figure 14B:
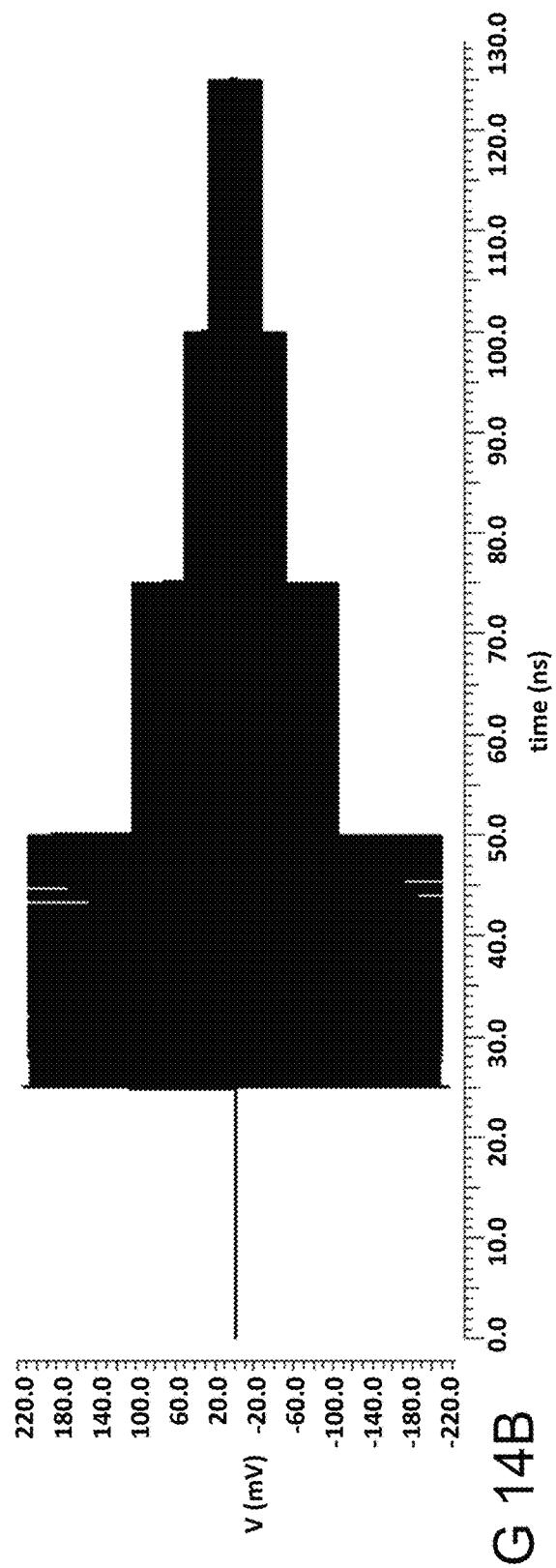
FIG. 14B shows a voltage of an exemplary stair case modulated signal over time.

FIG. 14B shows the voltage variations for a modulated input signal as used in FIG. 14A.

Figure 15:
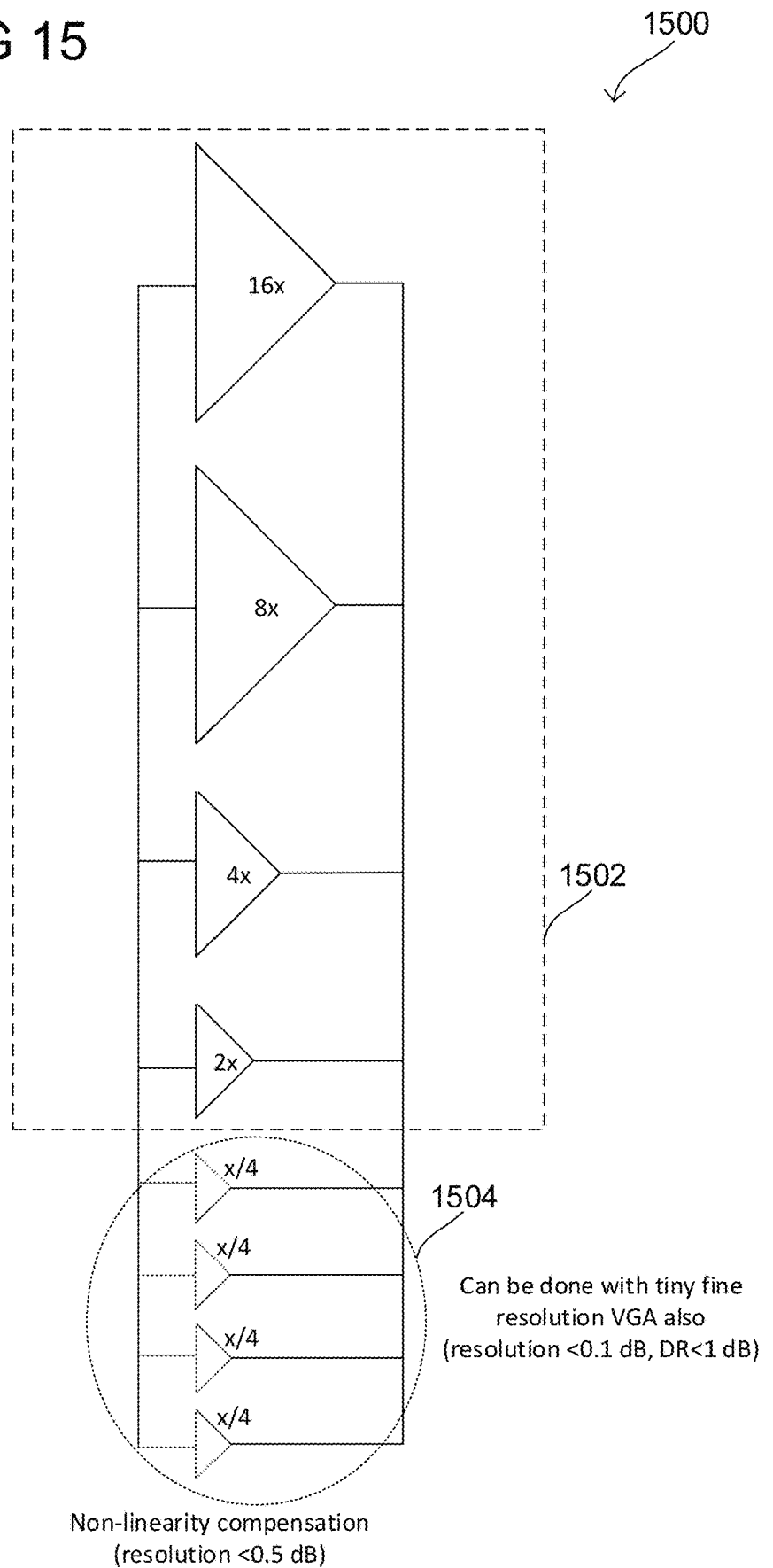
FIG. 15 shows an exemplary parallel PA block to compensate for switching state gains.

FIG. 15 shows a power amplifier 1500 with parallel PA blocks 1502 and 1504. PA block 1502, such as PA block 540 of FIG. 5, may be configured to generate a peak output power or Psat. Enabling and disabling PA slices may not be entirely linear. While proper layout matching can reduce the risk of gain variations due to switching PA slices on and off, it may generate gain variations. To accommodate any gain variations, PA block 1504 may be added in parallel to PA block 1502 to generate a power headroom that can be added to the output power of PA block 1502. For example, PA block 1504 may include 4 PA unit cells configured for a resolution of about 0.1 dB. PA block 1504 may generate a relatively small amount of power as compared to PA block 1502. For example, PA block 1504 may only produce a gain of approximately 0.5 dB to compensate for the gain variations for different switching states. The same thing can be done with a voltage gain amplifier (VGA) in case there is a finer resolution knob.

Figure 16:
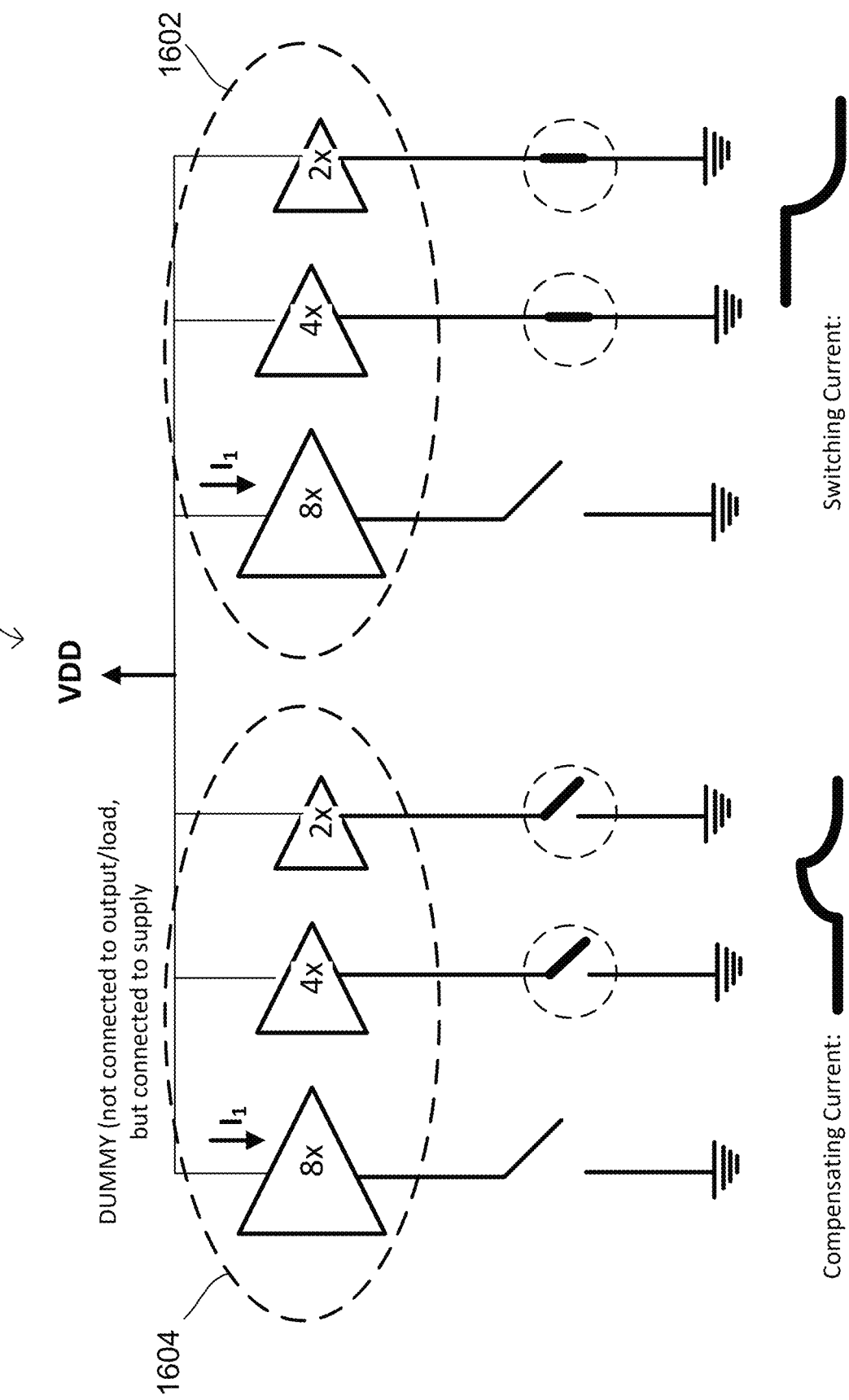
FIG. 16 shows an exemplary dummy PA to compensate for sudden change in load

FIG. 16 shows dummy PA block 1604 and PA block 1602. PA block 1602, such as PA block 540 of FIG. 5, may be configured to generate a peak output power or Psat. Suddenly enabling and disabling PA unit cells may cause an in-rush of transient currents on VDD. Dummy PA block 1604 is configured to connect to the same supply (VDD) as PA block 1602, but not connect to the same load as PA block 1602. While switching PA slices on and off in PA block 1602, PA block 1604 can be softly switched during the switching of PA block 1602 to compensate for the inrush of transient currents caused by the sudden change in load.

Figure 17B:
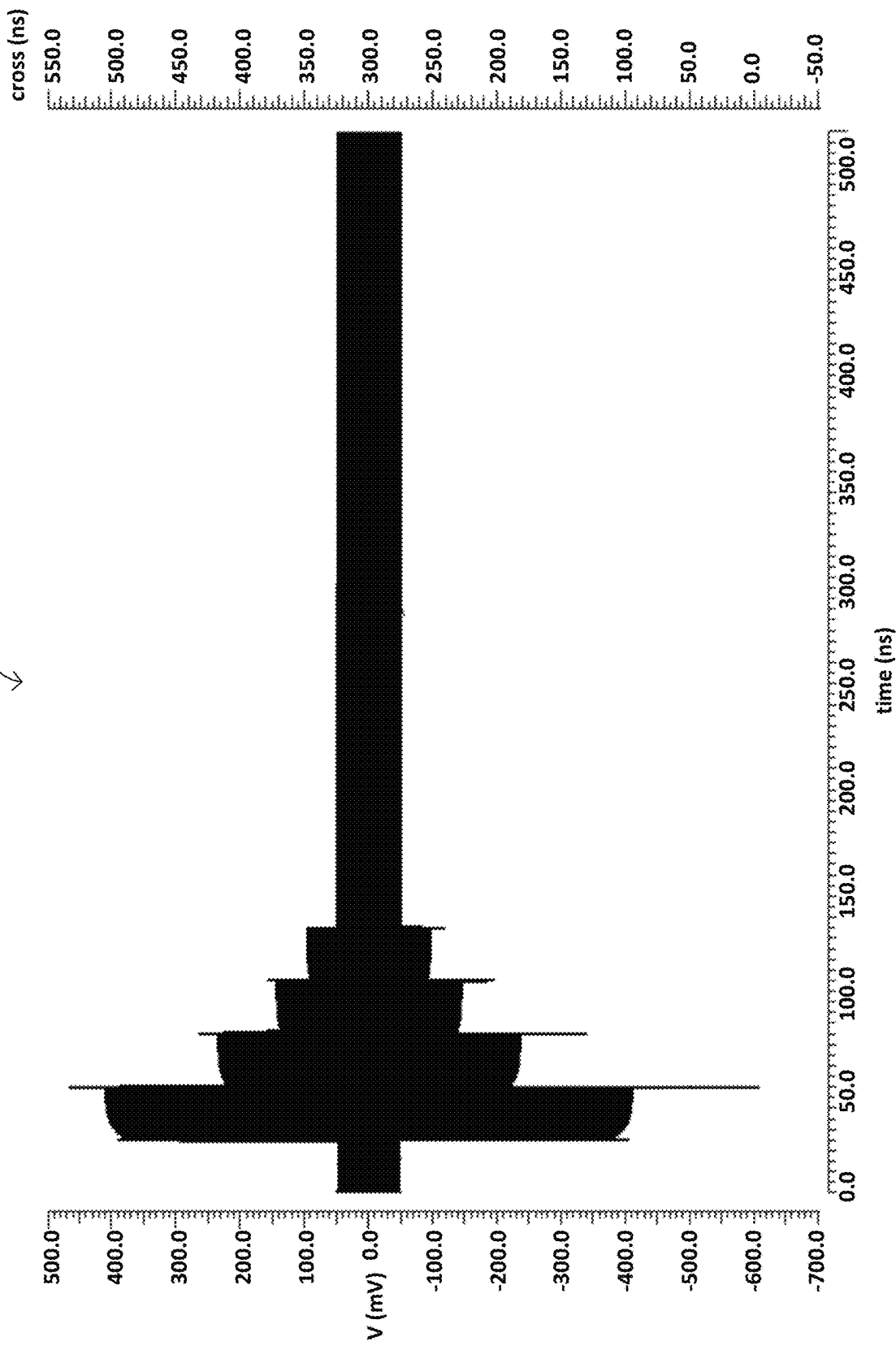
FIG. 17B shows a voltage of an exemplary modulated signal over time.

FIG. 17A shows a transient behavior 1700 of a modulated signal 1710 as shown in FIG. 17B. At time 1702, approximately 50 ns, PA slices may be switched on or off causing the transient behavior at time 1702 as shown in FIG. 17A.

Figure 18B:
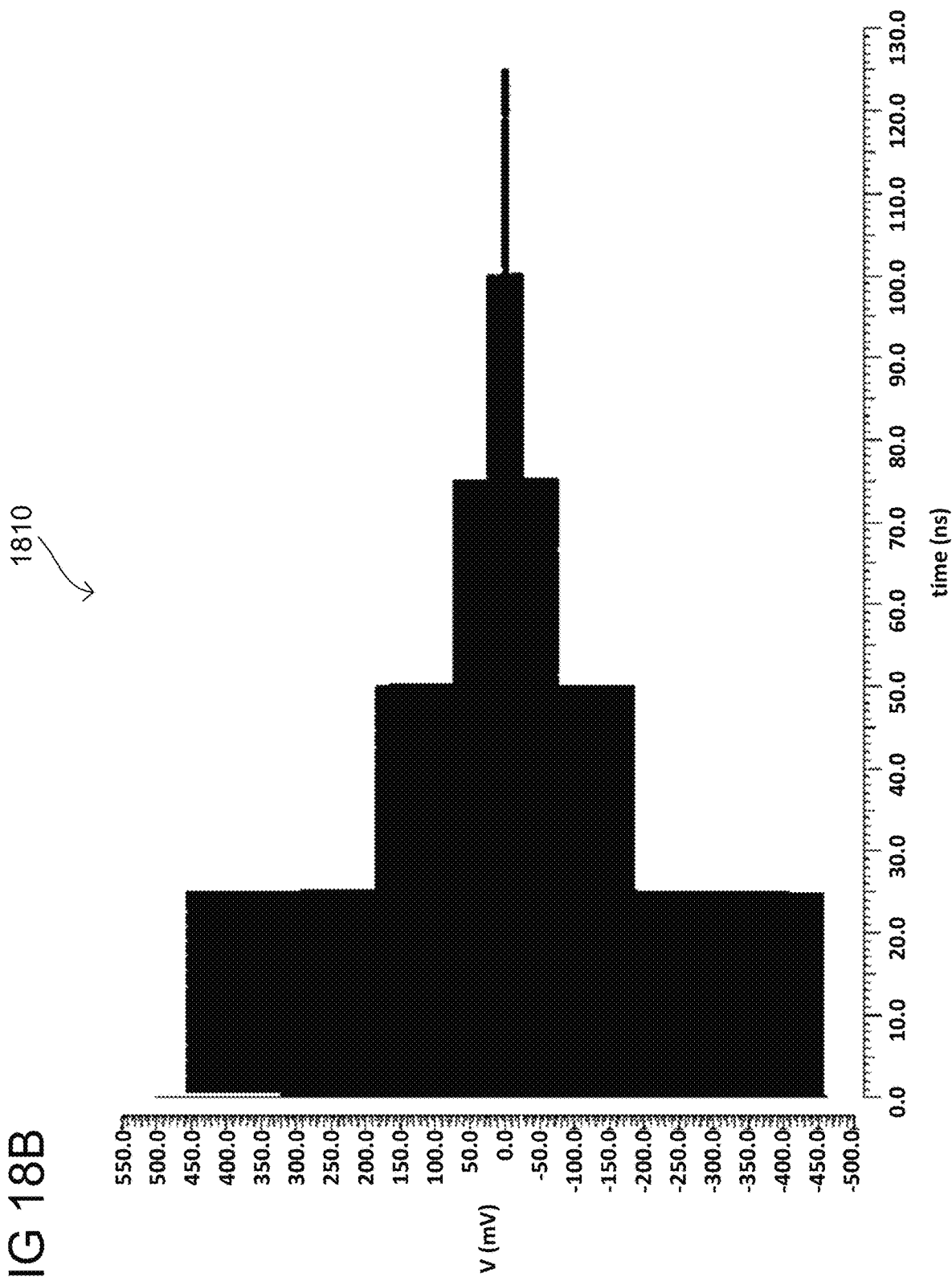
FIG. 18B shows a voltage of an exemplary modulated signal over time.

FIG. 18A shows a transient behavior 1800 for a PA device including a harmonic trap. The transient behavior 1800 shown is of a modulated signal 1810 as shown in FIG. 18B.

At approximately 25 ns, PA slices may be switched on or off causing noise. However, because the PA device includes a harmonic trap, the transient behavior as shown in FIG. 18A is reduced as compared to the transient behavior shown in FIG. 17A.

Figure 19:
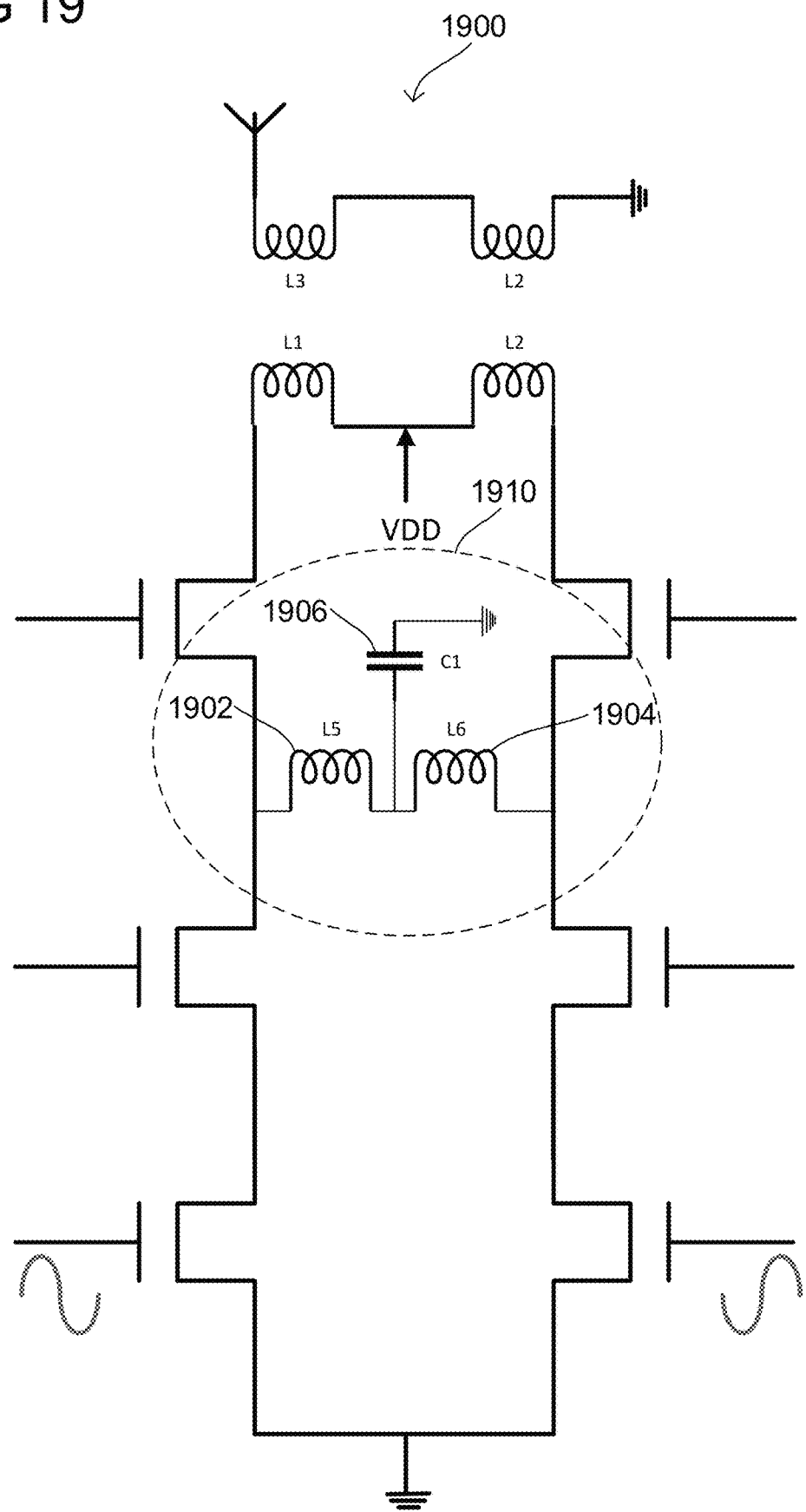
FIG. 19 shows an exemplary multi stack device including a harmonic trap within a power amplifier.

FIG. 19 shows a PA 1900 including harmonic trap 1910. For example, the PA device referred to with respect to FIGS. 18A and 18B. Harmonic trap 1910 includes first inductor 1902 and second inductor 1904. Harmonic trap further includes a capacitor 1906. Capacitor 1906 is electronically coupled to first inductor 1902 and second inductor 1904. Capacitor 1906 is further connected to a reference signal such as ground.

Suddenly turning on/off larger PA unit cells will lead to ringing at the output (RLC circuit). However, a harmonic trap greatly reduces this transient behavior shown in FIGS. 17A and 17B. FIGS. 17A and 18A show the transient output without and with a harmonic trap, respectively.

In the following, various examples of the present disclosure will be illustrated:

Example 1 is a power amplifier circuit including a plurality of analog power amplifiers configured to generate an output signal power; at least one processor configured to: select a highest output power; determine an input signal power of a modulated signal; determine an output signal power based on the input signal power; compare the output signal power and the highest output power; and disable a subset of the plurality of analog power amplifiers based on the comparison, wherein a remainder of the plurality of analog power amplifiers are configured to generate the output signal power.

In Example 2, the subject matter of Example 1 may optionally further include the one or more processors further configured to retrieve a power headroom and wherein the output signal power includes the power headroom.

In Example 3, the subject matter of any one of Examples 1 or 2 may optionally further include a parallel power amplifier block configured to generate the power headroom of up to 1 dB.

In Example 4, the subject matter of any one of Examples 1 to 3 may optionally further include an envelope detector, wherein the envelope detector is configured to receive an input signal; and determine the input signal power based on the input signal.

In Example 5, the subject matter of any one of Examples 1 to 4 may optionally further include the one or more processors further configured to determine the input signal power based on a plurality of input signal user data symbols, wherein the plurality of input signal user data symbols include one or more resource blocks.

In Example 6, the subject matter of any one of Examples 1 to 5 may optionally further include wherein the plurality of analog power amplifiers are single stack power amplifiers.

In Example 7, the subject matter of any one of Examples 1 to 6 may optionally further include wherein each of the plurality of analog power amplifiers includes a switch; and wherein the one or more processors are configured to open the switch to disable the power amplifier.

In Example 8, the subject matter of any one of Examples 1 to 7 may optionally further include wherein each of the plurality of analog power amplifiers includes a first power amplifier device and a second power amplifier device.

In Example 9, the subject matter of any one of Examples 1 to 8 may optionally further include wherein the one or more processors are configured to inject a gate voltage into each gate of the first power amplifier device or the second power amplifier device.

In Example 10, the subject matter of any one of Examples 1 to 9 may optionally further include wherein each of the plurality of analog power amplifiers includes three or more power amplifier devices.

In Example 11, the subject matter of any one of Examples 1 to 10 may optionally further include wherein the one or more processors are configured to inject a gate voltage into each gate of one of the power amplifier devices.

In Example 12, the subject matter of any one of Examples 1 to 11 may optionally further include a dummy power amplifier block, wherein the dummy power amplifier block is: not connected to a load; and connected to a power supply.

In Example 13, the subject matter of any one of Examples 1 to 12 may optionally further include a harmonic trap including a first inductor; a second inductor; and a capacitor electronically coupled to the first inductor and the second inductor, wherein the capacitor is further connected to a reference signal such as a ground reference signal.

Example 14 is a method for reducing static power consumption including: selecting a highest output power; determining an input signal power; determining an output signal power based on the input signal power; comparing the output signal power and the highest output power; and disabling a subset of a plurality of analog power amplifiers based on the comparison, wherein a remainder of the plurality of analog power amplifiers are configured to generate the output signal power.

In Example 15, the subject matter of Example 14 may optionally further include retrieving a power headroom; and including the power headroom in the output signal power.

In Example 16, the subject matter of any one of Examples 14 or 15 may optionally further include generating the power headroom of up to 1 dB.

In Example 17, the subject matter of any one of Examples 14 to 16 may optionally further include receiving an input signal envelope; and determining the input signal power based on the input signal.

In Example 18, the subject matter of any one of Examples 14 to 17 may optionally further include determining the input signal power based on a plurality of input signal user data symbols, wherein the plurality of input signal user data symbols include one or more resource blocks.

In Example 19, the subject matter of any one of Examples 14 to 18 may optionally further include wherein the subset of the plurality of analog power amplifiers are single stack power amplifiers.

In Example 20, the subject matter of any one of Examples 14 to 19 may optionally further include opening a tail switch of each of the subset of the plurality of analog power amplifiers.

In Example 21, the subject matter of any one of Examples 14 to 20 may optionally further include wherein each of the plurality of analog power amplifiers includes a first power amplifier device and a second power amplifier device.

In Example 22, the subject matter of any one of Examples 14 to 21 may optionally further include injecting a gate voltage into each gate of the first power amplifier device or the second power amplifier device.

In Example 23, the subject matter of any one of Examples 14 to 22 may optionally further include wherein each of the plurality of analog power amplifiers includes three or more power amplifier devices.

In Example 24, the subject matter of any one of Examples 14 to 23 may optionally further include injecting a gate voltage into each gate of one of the power amplifier devices.

Example 25 is a circuit including a memory; a plurality of analog power amplifiers configured to generate a maximum output power for an output signal; one or more processors coupled to the memory to execute the instructions stored in the memory, wherein the instructions are configured to: determine an input signal power; determine an output signal power based on the input signal power; compare the output signal power and the maximum output power; and disable a subset of the plurality of analog power amplifiers based on the comparison, wherein a remainder of the plurality of analog power amplifiers are configured to generate the output signal power.

Example 26 is a system including one or more devices according to Examples 1 to 13 and 25 configured to implement a method according to Examples 14 to 24.

Example 27 is one or more non-transitory computer readable media including programmable instructions thereon, that when executed by one or more processors of a device, cause the device to perform any one of the method of Examples 14 to 24.

Example 28 is a means for implementing any of the Examples 1 to 13 and 25.

While the above descriptions and connected figures may depict electronic device components as separate elements, skilled persons will appreciate the various possibilities to combine or integrate discrete elements into a single element. Such may include combining two or more circuits to form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc.

It is appreciated that implementations of methods detailed herein are demonstrative in nature and are thus understood as capable of being implemented in a corresponding device. Likewise, it is appreciated that implementations of devices detailed herein are understood as capable of being implemented with a corresponding method. It is thus understood that a device corresponding to a method detailed herein may include one or more components configured to perform each aspect of the related method.

All acronyms defined in the above description additionally hold in all claims included herein.

What is claimed is:

1. A power amplifier circuit comprising:
a plurality of analog power amplifiers configured to generate output signal power; and
at least one processor configured to:
select a highest output signal power;
determine an input signal power of a modulated signal, wherein the input signal power is based on a plurality of input signal user data symbols, wherein the plurality of input signal user data symbols include one or more resource blocks, wherein the input signal power is based on a count of the resource blocks in the plurality of input signal user data symbols, wherein the modulated signal comprises the plurality of input signal user data symbols;
determine an output signal power based on the input signal power;
compare the output signal power and the highest output signal power;
enable a power headroom; and
disable a subset of the plurality of analog power amplifiers based on the comparison, wherein a remainder of the plurality of analog power amplifiers are configured to generate the output signal power, wherein the output signal power includes the power headroom.

2. The circuit of claim 1 further comprising a parallel power amplifier block configured to generate the power headroom of up to ±1 dB.

3. The circuit of claim 1 further comprising an envelope detector, wherein the envelope detector is configured to receive an input signal; and
determine the input signal power based on the input signal.

4. The circuit of claim 1 wherein the plurality of analog power amplifiers are single stack power amplifiers.

5. The circuit of claim 4 wherein each of the plurality of single stack power amplifiers includes a switch; and wherein the one or more processors are configured to open the switch to disable the power amplifier.

6. The circuit of claim 1 wherein each of the plurality of analog power amplifiers includes a first power amplifier device and a second power amplifier device.

7. The circuit of claim 6 wherein the one or more processors are configured to selectively inject a gate voltage into each gate of the first power amplifier device or the second power amplifier device.

8. The circuit of claim 1 wherein each of the plurality of analog power amplifiers includes three or more power amplifier devices.

9. The circuit of claim 8 wherein the one or more processors are configured to selectively inject a gate voltage into each gate of one of the power amplifier devices.

10. The circuit of claim 1 further comprising a dummy power amplifier block, wherein the dummy power amplifier block is:
not connected to a load; and
connected to a power supply.

11. The circuit of claim 1 further including a harmonic trap, wherein the harmonic trap comprises:
a first inductor;
a second inductor; and
a capacitor operably coupled to the first inductor and the second inductor, wherein the capacitor is further connected to a reference signal.

12. A method for reducing static power consumption comprising:
selecting a highest output signal power;
determining an input signal power of a modulated signal based on a plurality of input signal user data symbols, wherein the plurality of input signal user data symbols include one or more resource blocks, wherein the input signal power is based on a count of the resource blocks in the plurality of input signal user data symbols, wherein the modulated signal comprises the plurality of input signal user data symbols;
determining an output signal power based on the input signal power;
comparing the output signal power and the highest output power; and
disabling a subset of a plurality of analog power amplifiers based on the comparison, wherein a remainder of the plurality of analog power amplifiers are configured to generate the output signal power.

13. The method of claim 12 further comprising:
enabling a power headroom; and
including the power headroom in the output signal power.

14. The method of claim 13 further comprising:
generating the power headroom of up to 1 dB.

15. The method of claim 13 further comprising:
receiving an input signal envelope; and
determining the input signal power based on the input signal envelope.

16. The method of claim 12 wherein the subset of the plurality of analog power amplifiers are single stack power amplifiers.

17. The method of claim 16 further comprising:
opening a tail switch of each of the subset of the plurality of analog power amplifiers.

\* \* \* \* \*